(12) United States Patent
Takaike et al.

(10) Patent No.: US 9,203,421 B2
(45) Date of Patent: Dec. 1, 2015

(54) SIGNAL PROCESSING APPARATUS, SIGNAL PROCESSING METHOD, AND NON-TRANSITORY COMPUTER-READABLE STORAGE MEDIUM STORING PROGRAM

(71) Applicant: Sony Corporation, Tokyo (JP)

(72) Inventors: Yoshihisa Takaike, Kanagawa (JP); Hideki Yokoshima, Kanagawa (JP); Gerd Spalink, Stuttgart (DE)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/549,748

(22) Filed: Nov. 21, 2014

(65) Prior Publication Data

US 2015/0162924 A1    Jun. 11, 2015

(30) Foreign Application Priority Data

Dec. 10, 2013  (JP) .................................. 2013-254733

(51) Int. Cl.
*H03M 1/12* (2006.01)
*H03M 1/00* (2006.01)
*H03M 1/18* (2006.01)
*H03M 1/06* (2006.01)

(52) U.S. Cl.
CPC ................ *H03M 1/002* (2013.01); *H03M 1/06* (2013.01); *H03M 1/12* (2013.01); *H03M 1/181* (2013.01)

(58) Field of Classification Search
CPC ......... H03M 1/06; H03M 1/12; H03M 1/002; H03M 1/181
USPC .......................................... 341/155, 120, 118
See application file for complete search history.

(56) References Cited

U.S. PATENT DOCUMENTS

| | | | | |
|---|---|---|---|---|
| 5,677,962 A * | 10/1997 | Harrison et al. | ............... | 381/109 |
| 7,085,334 B2 * | 8/2006 | Burke et al. | ................... | 375/345 |
| 8,428,202 B2 * | 4/2013 | Braicu et al. | ................... | 375/345 |
| 8,605,836 B2 * | 12/2013 | Murthy et al. | ................ | 375/345 |
| 2012/0225631 A1 | 9/2012 | Spalink | | |

* cited by examiner

*Primary Examiner* — Brian Young
(74) *Attorney, Agent, or Firm* — Michael Best & Friedrich LLP

(57) ABSTRACT

To enable processing of a signal at an appropriate level.
An analog section in which an acquired signal is processed in an analog fashion and a digital section in which the signal processed in the analog section is digitally processed are included, wherein the analog section includes an adjustment unit that adjusts a gain discretely and the digital section includes a digital step compensation unit that compensates for discrete gain adjustments in the analog section. The digital step compensation unit responds to a transient step in which a gain steeply converts in the analog section and compensates with inverse characteristics of a transient response. The present technology can be applied to an AGC (Automatic Gain Control) system.

20 Claims, 22 Drawing Sheets

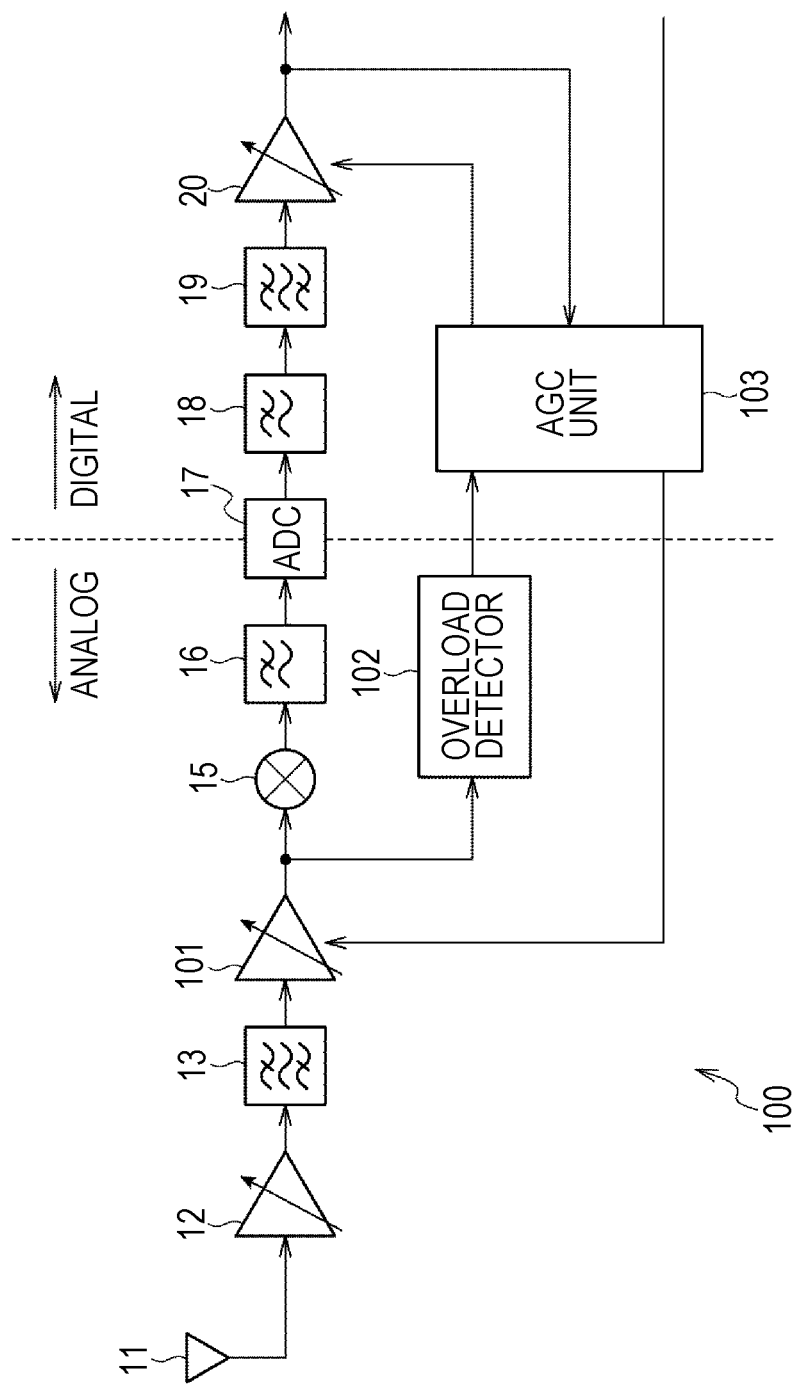

FIG. 20

| TOTAL GAIN [dB] | LNA 12 | | FIRST VARIABLE ATTENUATOR 201 | | GAIN FIXED AMPLIFIER 202 | SECOND VARIABLE ATTENUATOR 203 | | FREQUENCY CONVERSION UNIT 15 |
|---|---|---|---|---|---|---|---|---|
| | CONTROL SIGNAL A | GAIN[dB] | CONTROL SIGNAL B | GAIN[dB] | GAIN[dB] | CONTROL SIGNAL C | GAIN[dB] | GAIN[dB] |
| 85 | 0 | 15 | 0 | 0 | 40 | 0 | 0 | 30 |
| 82 | 0 | 15 | 1 | -3 | 40 | 0 | 0 | 30 |
| 79 | 0 | 15 | 2 | -6 | 40 | 0 | 0 | 30 |
| 76 | 0 | 15 | 3 | -9 | 40 | 0 | 0 | 30 |
| 73 | 0 | 15 | 4 | -12 | 40 | 0 | 0 | 30 |
| 70 | 1 | 0 | 0 | 0 | 40 | 0 | 0 | 30 |
| 67 | 1 | 0 | 1 | -3 | 40 | 0 | 0 | 30 |
| 64 | 1 | 0 | 2 | -6 | 40 | 0 | 0 | 30 |
| 61 | 1 | 0 | 3 | -9 | 40 | 0 | 0 | 30 |
| 58 | 1 | 0 | 4 | -12 | 40 | 0 | 0 | 30 |
| 55 | 1 | 0 | 5 | -15 | 40 | 0 | 0 | 30 |
| 52 | 1 | 0 | 6 | -18 | 40 | 0 | 0 | 30 |
| 49 | 1 | 0 | 7 | -21 | 40 | 0 | 0 | 30 |
| 46 | 1 | 0 | 8 | -24 | 40 | 0 | 0 | 30 |
| 43 | 1 | 0 | 9 | -27 | 40 | 0 | 0 | 30 |
| 40 | 1 | 0 | 10 | -30 | 40 | 0 | 0 | 30 |
| 37 | 1 | 0 | 10 | -30 | 40 | 1 | -3 | 30 |
| 34 | 1 | 0 | 10 | -30 | 40 | 2 | -6 | 30 |
| 31 | 1 | 0 | 10 | -30 | 40 | 3 | -9 | 30 |
| 28 | 1 | 0 | 10 | -30 | 40 | 4 | -12 | 30 |
| 25 | 1 | 0 | 10 | -30 | 40 | 5 | -15 | 30 |
| 22 | 1 | 0 | 10 | -30 | 40 | 6 | -18 | 30 |
| 19 | 1 | 0 | 10 | -30 | 40 | 7 | -21 | 30 |
| 16 | 1 | 0 | 10 | -30 | 40 | 8 | -24 | 30 |
| 13 | 1 | 0 | 10 | -30 | 40 | 9 | -27 | 30 |
| 10 | 1 | 0 | 10 | -30 | 40 | 10 | -30 | 30 |
| 7 | 1 | 0 | 10 | -30 | 40 | 11 | -33 | 30 |
| 4 | 1 | 0 | 10 | -30 | 40 | 12 | -36 | 30 |
| 1 | 1 | 0 | 10 | -30 | 40 | 13 | -39 | 30 |
| -2 | 1 | 0 | 10 | -30 | 40 | 14 | -42 | 30 |
| -5 | 1 | 0 | 10 | -30 | 40 | 15 | -45 | 30 |

FIG. 21

| TOTAL GAIN [dB] | LNA 12 | | FIRST VARIABLE ATTENUATOR 201 | | GAIN FIXED AMPLIFIER 202 | SECOND VARIABLE ATTENUATOR 203 | | FREQUENCY CONVERSION UNIT 15 |
|---|---|---|---|---|---|---|---|---|
| | CONTROL SIGNAL A | GAIN[dB] | CONTROL SIGNAL B | GAIN[dB] | GAIN[dB] | CONTROL SIGNAL C | GAIN[dB] | GAIN[dB] |
| 85 | 0 | 15 | 0 | 0 | 40 | 0 | 0 | 30 |
| 82 | 0 | 15 | 0 | 0 | 40 | 1 | -3 | 30 |
| 79 | 0 | 15 | 0 | 0 | 40 | 2 | -6 | 30 |
| 76 | 0 | 15 | 0 | 0 | 40 | 3 | -9 | 30 |
| 73 | 0 | 15 | 0 | 0 | 40 | 4 | -12 | 30 |
| 70 | 1 | 0 | 0 | 0 | 40 | 0 | 0 | 30 |
| 67 | 1 | 0 | 0 | 0 | 40 | 1 | -3 | 30 |
| 64 | 1 | 0 | 0 | 0 | 40 | 2 | -6 | 30 |
| 61 | 1 | 0 | 0 | 0 | 40 | 3 | -9 | 30 |
| 58 | 1 | 0 | 0 | 0 | 40 | 4 | -12 | 30 |
| 55 | 1 | 0 | 0 | 0 | 40 | 5 | -15 | 30 |
| 52 | 1 | 0 | 0 | 0 | 40 | 6 | -18 | 30 |
| 49 | 1 | 0 | 0 | 0 | 40 | 7 | -21 | 30 |
| 46 | 1 | 0 | 0 | 0 | 40 | 8 | -24 | 30 |
| 43 | 1 | 0 | 0 | 0 | 40 | 9 | -27 | 30 |
| 40 | 1 | 0 | 0 | 0 | 40 | 10 | -30 | 30 |
| 37 | 1 | 0 | 0 | 0 | 40 | 11 | -33 | 30 |
| 34 | 1 | 0 | 0 | 0 | 40 | 12 | -36 | 30 |
| 31 | 1 | 0 | 0 | 0 | 40 | 13 | -39 | 30 |
| 28 | 1 | 0 | 0 | 0 | 40 | 14 | -42 | 30 |
| 25 | 1 | 0 | 0 | 0 | 40 | 15 | -45 | 30 |
| 22 | 1 | 0 | 1 | -3 | 40 | 15 | -45 | 30 |
| 19 | 1 | 0 | 2 | -6 | 40 | 15 | -45 | 30 |
| 16 | 1 | 0 | 3 | -9 | 40 | 15 | -45 | 30 |
| 13 | 1 | 0 | 4 | -12 | 40 | 15 | -45 | 30 |
| 10 | 1 | 0 | 5 | -15 | 40 | 15 | -45 | 30 |
| 7 | 1 | 0 | 6 | -18 | 40 | 15 | -45 | 30 |
| 4 | 1 | 0 | 7 | -21 | 40 | 15 | -45 | 30 |
| 1 | 1 | 0 | 8 | -24 | 40 | 15 | -45 | 30 |
| -2 | 1 | 0 | 9 | -27 | 40 | 15 | -45 | 30 |
| -5 | 1 | 0 | 10 | -30 | 40 | 15 | -45 | 30 |

FIG. 22

| TOTAL GAIN [dB] | LNA 12 | | FIRST VARIABLE ATTENUATOR 201 | | GAIN FIXED AMPLIFIER 202 | SECOND VARIABLE ATTENUATOR 203 | | FREQUENCY CONVERSION UNIT 15 |
|---|---|---|---|---|---|---|---|---|
| | CONTROL SIGNAL A | GAIN[dB] | CONTROL SIGNAL B | GAIN[dB] | GAIN[dB] | CONTROL SIGNAL C | GAIN[dB] | GAIN[dB] |
| 85 | 0 | 15 | 0 | 0 | 40 | 0 | 0 | 30 |
| 82 | 0 | 15 | 1 | -3 | 40 | 0 | 0 | 30 |
| 79 | 0 | 15 | 2 | -6 | 40 | 0 | 0 | 30 |
| 76 | 0 | 15 | 3 | -9 | 40 | 0 | 0 | 30 |
| 73 | 0 | 15 | 4 | -12 | 40 | 0 | 0 | 30 |
| 70 | 0 | 15 | 5 | -15 | 40 | 0 | 0 | 30 |
| 67 | 0 | 15 | 6 | -18 | 40 | 0 | 0 | 30 |
| 64 | 0 | 15 | 7 | -21 | 40 | 0 | 0 | 30 |
| 61 | 0 | 15 | 8 | -24 | 40 | 0 | 0 | 30 |
| 58 | 0 | 15 | 9 | -27 | 40 | 0 | 0 | 30 |
| 55 | 1 | 0 | 5 | -15 | 40 | 0 | 0 | 30 |
| 52 | 1 | 0 | 6 | -18 | 40 | 0 | 0 | 30 |
| 49 | 1 | 0 | 7 | -21 | 40 | 0 | 0 | 30 |
| 46 | 1 | 0 | 8 | -24 | 40 | 0 | 0 | 30 |
| 43 | 1 | 0 | 9 | -27 | 40 | 0 | 0 | 30 |
| 40 | 1 | 0 | 10 | -30 | 40 | 0 | 0 | 30 |
| 37 | 1 | 0 | 10 | -30 | 40 | 1 | -3 | 30 |
| 34 | 1 | 0 | 10 | -30 | 40 | 2 | -6 | 30 |
| 31 | 1 | 0 | 10 | -30 | 40 | 3 | -9 | 30 |
| 28 | 1 | 0 | 10 | -30 | 40 | 4 | -12 | 30 |
| 25 | 1 | 0 | 10 | -30 | 40 | 5 | -15 | 30 |
| 22 | 1 | 0 | 10 | -30 | 40 | 6 | -18 | 30 |
| 19 | 1 | 0 | 10 | -30 | 40 | 7 | -21 | 30 |
| 16 | 1 | 0 | 10 | -30 | 40 | 8 | -24 | 30 |
| 13 | 1 | 0 | 10 | -30 | 40 | 9 | -27 | 30 |
| 10 | 1 | 0 | 10 | -30 | 40 | 10 | -30 | 30 |
| 7 | 1 | 0 | 10 | -30 | 40 | 11 | -33 | 30 |
| 4 | 1 | 0 | 10 | -30 | 40 | 12 | -36 | 30 |
| 1 | 1 | 0 | 10 | -30 | 40 | 13 | -39 | 30 |
| -2 | 1 | 0 | 10 | -30 | 40 | 14 | -42 | 30 |
| -5 | 1 | 0 | 10 | -30 | 40 | 15 | -45 | 30 |

FIG. 23

| TOTAL GAIN [dB] | LNA 12 | | FIRST VARIABLE ATTENUATOR 201 | | GAIN FIXED AMPLIFIER 202 | SECOND VARIABLE ATTENUATOR 203 | | FREQUENCY CONVERSION UNIT 15 |
|---|---|---|---|---|---|---|---|---|
| | CONTROL SIGNAL A | GAIN[dB] | CONTROL SIGNAL B | GAIN[dB] | GAIN[dB] | CONTROL SIGNAL C | GAIN[dB] | GAIN[dB] |
| 85 | 0 | 15 | 0 | 0 | 40 | 0 | 0 | 30 |
| 82 | 0 | 15 | 1 | -3 | 40 | 0 | 0 | 30 |
| 79 | 0 | 15 | 1 | -3 | 40 | 1 | -3 | 30 |
| 76 | 0 | 15 | 2 | -6 | 40 | 1 | -3 | 30 |
| 73 | 0 | 15 | 2 | -6 | 40 | 2 | -6 | 30 |
| 70 | 1 | 0 | 0 | 0 | 40 | 0 | 0 | 30 |
| 67 | 1 | 0 | 1 | -3 | 40 | 0 | 0 | 30 |
| 64 | 1 | 0 | 1 | -3 | 40 | 1 | -3 | 30 |
| 61 | 1 | 0 | 2 | -6 | 40 | 1 | -3 | 30 |
| 58 | 1 | 0 | 2 | -6 | 40 | 2 | -6 | 30 |
| 55 | 1 | 0 | 3 | -9 | 40 | 2 | -6 | 30 |
| 52 | 1 | 0 | 3 | -9 | 40 | 3 | -9 | 30 |
| 49 | 1 | 0 | 4 | -12 | 40 | 3 | -9 | 30 |
| 46 | 1 | 0 | 4 | -12 | 40 | 4 | -12 | 30 |
| 43 | 1 | 0 | 5 | -15 | 40 | 4 | -12 | 30 |
| 40 | 1 | 0 | 5 | -15 | 40 | 5 | -15 | 30 |
| 37 | 1 | 0 | 6 | -18 | 40 | 5 | -15 | 30 |
| 34 | 1 | 0 | 6 | -18 | 40 | 6 | -18 | 30 |
| 31 | 1 | 0 | 7 | -21 | 40 | 6 | -18 | 30 |
| 28 | 1 | 0 | 7 | -21 | 40 | 7 | -21 | 30 |
| 25 | 1 | 0 | 8 | -24 | 40 | 7 | -21 | 30 |
| 22 | 1 | 0 | 8 | -24 | 40 | 8 | -24 | 30 |
| 19 | 1 | 0 | 9 | -27 | 40 | 8 | -24 | 30 |
| 16 | 1 | 0 | 9 | -27 | 40 | 9 | -27 | 30 |
| 13 | 1 | 0 | 10 | -30 | 40 | 9 | -27 | 30 |
| 10 | 1 | 0 | 10 | -30 | 40 | 10 | -30 | 30 |
| 7 | 1 | 0 | 10 | -30 | 40 | 11 | -33 | 30 |
| 4 | 1 | 0 | 10 | -30 | 40 | 12 | -36 | 30 |
| 1 | 1 | 0 | 10 | -30 | 40 | 13 | -39 | 30 |
| -2 | 1 | 0 | 10 | -30 | 40 | 14 | -42 | 30 |
| -5 | 1 | 0 | 10 | -30 | 40 | 15 | -45 | 30 |

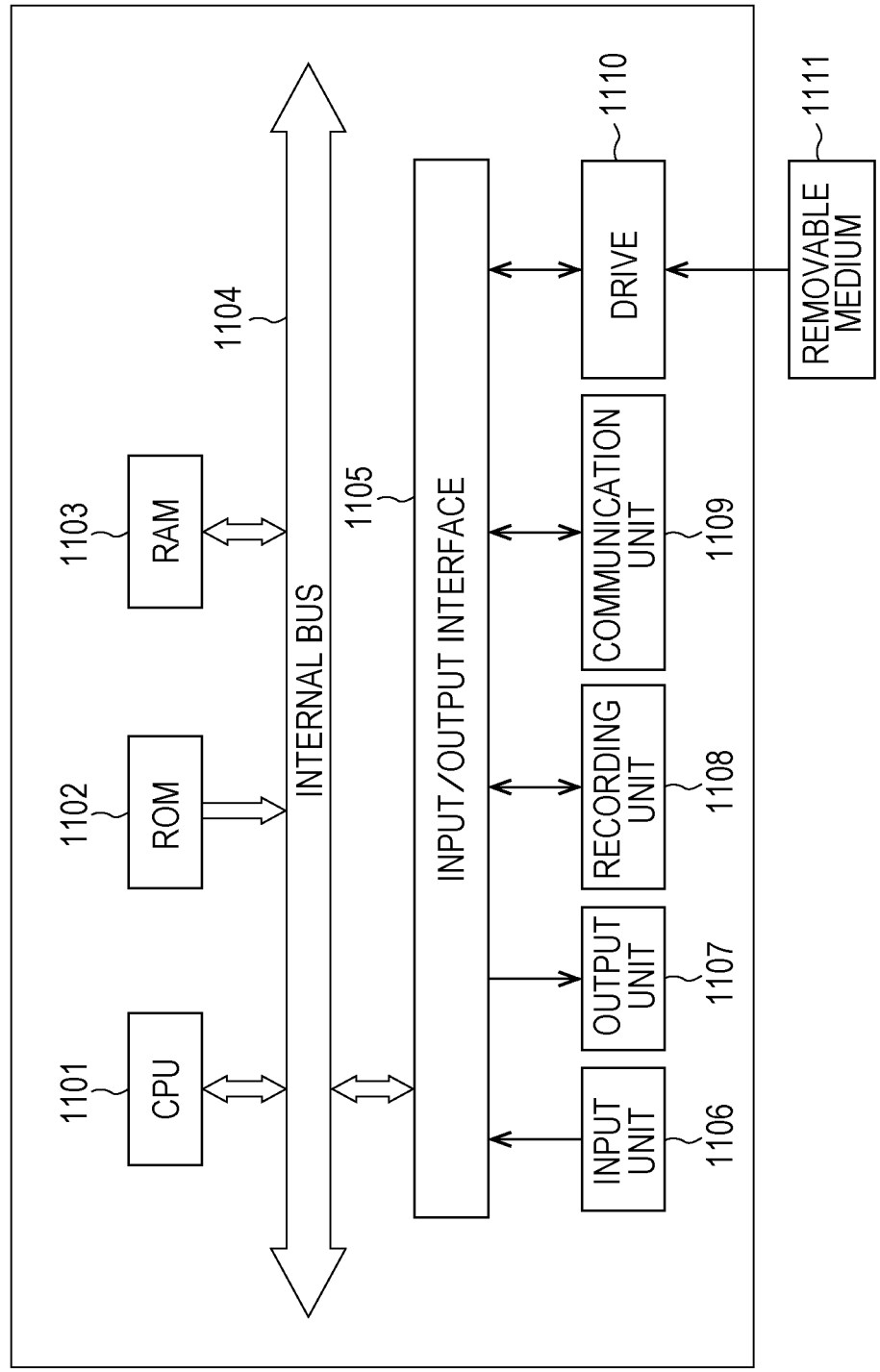

US 9,203,421 B2

SIGNAL PROCESSING APPARATUS, SIGNAL PROCESSING METHOD, AND NON-TRANSITORY COMPUTER-READABLE STORAGE MEDIUM STORING PROGRAM

CROSS REFERENCE TO RELATED APPLICATIONS

This application claims the benefit of Japanese Priority Patent Application JP 2013-254733 filed on Dec. 10, 2013, the entire contents of which are incorporated herein by reference.

TECHNICAL FIELD

The present technology relates to a signal processing apparatus, a signal processing method, and a program. In particular, the present technology relates to a signal processing apparatus, a signal processing method, and a non-transitory computer-readable storage medium storing a program suitable for realizing lower power consumption and size reduction.

BACKGROUND ART

There has been a concern about increased power consumption due to larger screens of TV sets and the reduction in power consumption is desired. On the other hand, the size of TV sets is reduced and products reduced to a size that can be carried are also becoming increasingly popular. TV sets reduced in size are, for example, embedded in other devices such as portable phones and thus, further size reduction and lower power consumption are desired.

PTL 1 proposes the reduction in power consumption and size reduction of a circuit by adopting discrete control for an AGC (Automatic Gain Control) system included in a tuner of a TV set.

CITATION LIST

Patent Literature

[PTL 1]
US-A1-20120225631

SUMMARY

Technical Problem

If an AGC system is controlled discretely, while lower power consumption and size reduction of a circuit can be realized, the gain changes discretely and thus, there is a possibility that a transient response of signal output when the gain changes becomes steep. When such a steep response occurs, it is difficult to perform demodulation processing normally and demodulation performance may be degraded.

Therefore, it is desirable to reduce power consumption of an AGC system and reduce the size of a circuit so that demodulation performance is not affected.

The present technology is developed in view of the above circumstances and demodulation performance can be made unaffected by reducing power consumption and reducing the size of a circuit.

Solution to Problem

A signal processing apparatus according to an embodiment of the present technology includes an analog section in which an acquired signal is processed in an analog fashion and a digital section in which the signal processed in the analog section is digitally processed, wherein the analog section includes an adjustment unit that adjusts a gain discretely and the digital section includes a digital step compensation unit that compensates for discrete gain adjustments in the analog section.

The digital step compensation unit can respond to a transient step in which a gain steeply converts in the analog section and compensate with inverse characteristics of a transient response.

The digital step compensation unit can adjust the gain in a width smaller than the width of the gain adjusted by the adjustment unit.

A gain control unit that controls the gain of the adjustment unit and the digital step compensation unit and an overload detector that detects a signal level of the signal and outputs a comparison result with a predetermined threshold are further included, wherein the gain control unit can control the gain based on the comparison result from the overload detector.

The overload detector has a first threshold and a second threshold larger than the first threshold and when the signal level is larger than the first threshold and smaller than the second threshold as the comparison result, the gain control unit can exercise control that maintains the gain set at that time.

The overload detector can detect the signal level of the signal from the adjustment unit and the gain control unit can control the gain of the adjustment unit.

The gain control unit can have hysteresis.

The gain control unit can exercise different control when the gain necessary for the analog section rises and falls.

The gain control unit includes LUT (Look-Up-Table) and can correct discrete gain variations in the analog section by referring to the LUT.

The LUT can be created by a value measured by the gain control unit when a test signal is input being stored therein.

The adjustment unit can include an LNA (Low Noise Amplifier) and a variable attenuator.

A plurality of the variable attenuators is included and the gain control unit can control the gain of each of the LNA and the plurality of variable attenuators.

The LNA can discretely set the gain at binary or more gray scale.

The variable attenuator can discretely set the gain and the width thereof may be a fixed width or a width that is different from step to step.

The gain control unit can raise the gain of the LNA after lowering the gain of the variable attenuator when the gain necessary for the analog section is raised and raise the gain of the variable attenuator after lowering the gain of the LNA when the gain necessary for the analog section is lowered.

A signal processing method according to an embodiment of the present technology is a signal processing method of a signal processing apparatus including an analog section in which an acquired signal is processed in an analog fashion and a digital section in which the signal processed in the analog section is digitally processed, including adjusting a gain discretely in the analog section and making digital step compensation in the digital section that compensates for discrete gain adjustments in the analog section.

A program according to an embodiment of the present technology is a program causing a computer that controls a signal processing apparatus including an analog section in which an acquired signal is processed in an analog fashion and a digital section in which the signal processed in the analog section is digitally processed to perform processing including adjusting a gain discretely in the analog section and making digital step compensation in the digital section that compensates for discrete gain adjustments in the analog section.

In a signal processing apparatus, a signal processing method, and a program according to an embodiment of the present technology, a signal is acquired and processed in an analog fashion and then, processed digitally. A gain is adjusted discretely in the analog processing and processing to compensate for analog discrete gain adjustments is performed in the digital processing.

Advantageous Effects of Invention

According to an aspect of the present technology, demodulation performance can be made unaffected by reducing power consumption and reducing the size of a circuit.

Effects described here are not necessarily to be limited and the effect may be any effect described in the present disclosure.

BRIEF DESCRIPTION OF DRAWINGS

FIG. 5 is a diagram showing the configuration of an embodiment of the AGC system to which the present technology is applied.
FIG. 20 is a diagram showing an example of an adjustment pattern.
FIG. 21 is a diagram showing an example of the adjustment pattern.
FIG. 22 is a diagram showing an example of the adjustment pattern.
FIG. 23 is a diagram showing an example of the adjustment pattern.

FIG. 24 is a diagram illustrating a recording medium.

DESCRIPTION OF EMBODIMENTS

A form (hereinafter, called an embodiment) to carry out the present technology will be described below. The description will be provided in the order shown below:
1. Configuration of AGC System Controlled Continuously
2. Configuration of AGC System Controlled Discretely
3. Configuration of Overload Detector
4. Another Configuration of AGC System Controlled Discretely
5. Configuration of Overload Detector
6. Control Using Hysteresis
7. Correction of Non-Uniform Step Width
8. Control of LNA
9. Recording Medium <Configuration of AGC System Controlled Continuously>

The present technology can be applied to a TV set and so will be described by taking the TV set as an example. Also, the present technology can be applied to a tuner unit constituting the TV set and further to an AGC (Automatic Gain Control) system included in the tuner unit and so the AGC system is taken as an example in the following description.

While the present technology is described by taking an AGC system included in a TV set as an example, an AGC system to which the present technology can also be applied to other apparatuses than the TV set and can be applied to a signal processing apparatus that processes a predetermined signal and the like.

As an AGC system, a system in which the gain is continuously adjusted by an analog section and a system in which the gain is discretely adjusted are proposed.

The present technology can be applied to an AGC system that discretely adjusts the gain and for the purpose of comparison, an AGC system that continuously adjusts the gain will first be described and then, an AGC system to which the present technology is applied and which discretely adjusts the gain will be described.

Figure 1:
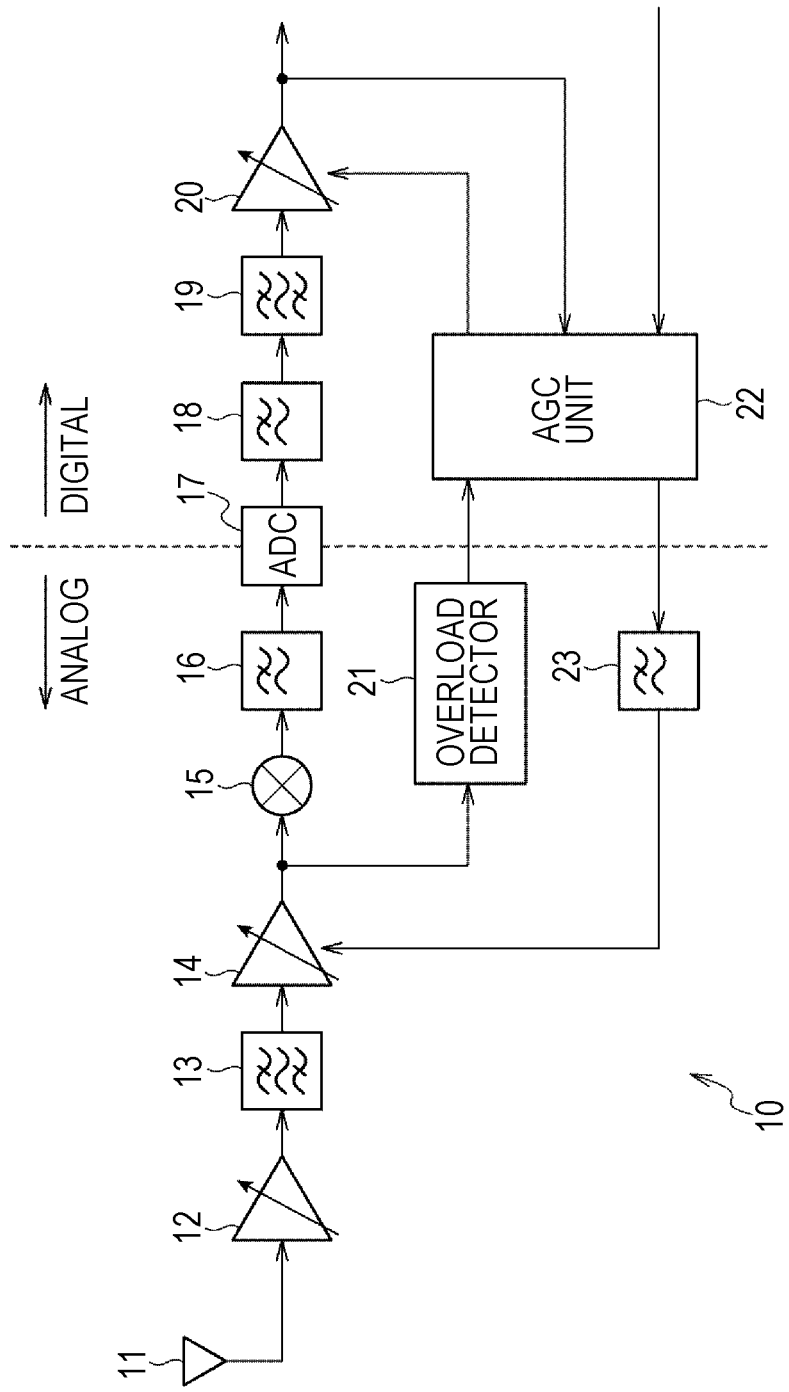
FIG. 1 is a diagram showing an example of an AGC system.

FIG. 1 is a diagram showing the configuration of an example of an AGC system in which the gain is continuously adjusted by an analog section. An AGC system 10 shown in FIG. 1 includes an antenna 11, an LNA (Low Noise Amplifier) 12, an RF (Radio Frequency) filter 13, a gain variable amplifier 14, a frequency conversion unit 15, an IF (Intermediate Frequency) filter 16, an ADC (Analog to Digital Converter) unit 17, a decimation filter 18, a neighboring channel filter 19, a digital gain variable amplifier 20, an overload detector 21, an AGC unit 22, a PWM (Pulse Width Modulation) filter 23. The antenna 11 is provided to receive a broadcast wave modulated with carrier waves and the size, shape, orientation and the like thereof are optimized depending on the frequency to be received, the location of installation and so on. A signal received by the antenna 11 is supplied to the LNA 12. The LNA 12 is a low noise amplifier that amplifies an input signal and can improve the signal to noise ratio (SNR) by being provided in an initial stage of the system. The LNA 12 may be configured by discrete components other than IC. The control (ON/OFF) thereof generally depends on a control signal from outside.

The RF filter 13 is used, when a radio frequency (high-frequency) band is received, for the purpose of suppressing disturbing waves leading to signal quality degradation. The gain variable amplifier 14 is an amplifier to make a received signal level variable and the gain thereof changes depending on a given control signal to change noise and distortion characteristics.

The frequency conversion unit 15 is used to down-convert a broadcast wave signal modulated with carrier waves to a frequency band of the ADC unit 17. The IF filter 16 is used for the purpose of suppressing disturbing waves of the frequency band close to that of a received signal.

The ADC unit 17 is used to convert a received signal from an analog signal into a digital signal.

The decimation filter 18 performs processing to lower the sampling frequency to a minimum necessary frequency. The processing is decimation processing and a digital low-pass filter used to remove aliasing frequency components is called a decimation filter and so the filter is denoted here as the decimation filter 18.

The neighboring channel filter 19 is a digital band-pass filter to suppress disturbing waves of neighboring frequency bands. The neighboring channel filter 19 generally has steep frequency characteristics that allow only receiving bands to pass.

The digital gain variable amplifier 20 is a digital amplifier to make the received signal level after sampling variable. The digital gain variable amplifier 20 is generally a linear circuit and is designed such that SNR and distortion characteristics thereof are not changed by the gain.

The overload detector 21 detects disturbing waves that degrade quality of a received signal. The disturbing wave signal level to be detected is sufficiently larger than that of a received signal and thus, the overload detector 21 is configured not to be detected by a received signal.

The AGC unit 22 controls the gain of each unit of an analog section and a digital section based on difference information between a threshold set in a demodulation unit (not shown) in a subsequent stage of the system and a signal level input into the demodulation unit and output information from the overload detector 21.

The analog section is a portion positioned on the left side of a dotted line shown in the ADC unit 17 in FIG. 1 and the digital section is a portion positioned on the right side of the dotted line. That is, the analog section includes the LNA 12, the RF filter 13, the gain variable amplifier 14, the frequency conversion unit 15, the IF filter 16, the overload detector 21, and the PWM filter 23 and the digital section includes the decimation filter 18, the neighboring channel filter 19, the digital gain variable amplifier 20, and the AGC unit 22.

The PWM filter 23 is a low-pass filter to smooth an analog PWM signal output from the AGC unit 22 to control the gain variable amplifier 14.

In the AGC system 10 configured as shown in FIG. 1, gains of the analog section and digital section are appropriately controlled by the AGC unit 22. When there is no disturbing wave signal, gains are controlled based on a feedback signal from the demodulation unit (not shown) in the subsequent stage or an output level of the digital gain variable amplifier 20 and when there is a disturbing wave signal, gains are controlled by detection output from the overload detector 21 being further incorporated into an AGC loop.

Figure 2:
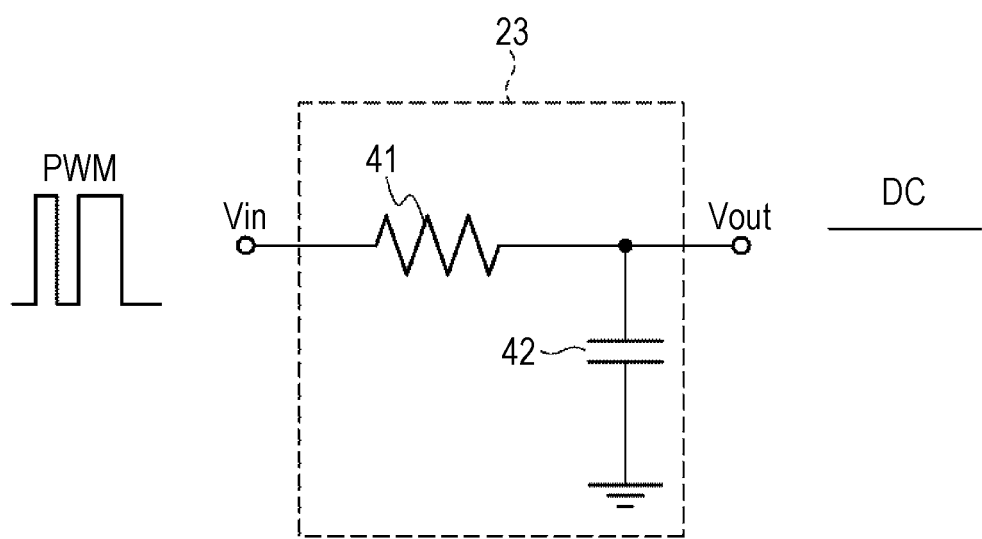
FIG. 2 is a diagram illustrating a PWM filter.

In the AGC system 10, a PWM signal to be control output to analog is smoothed by the PWM filter 23 (low-pass filter) configured by a resistor 41 and a capacitor 42 as shown in FIG. 2 and the gain variable amplifier 14 in the analog section is controlled by a DC voltage smoothed by the PWM filter 23.

The AGC system 10 in which the conversion is continuous and a control signal changes in an analog fashion is generally called a continuous AGC system. Here, AGC system 10 is described as an AGC system that continuously controls.

Figure 3A:
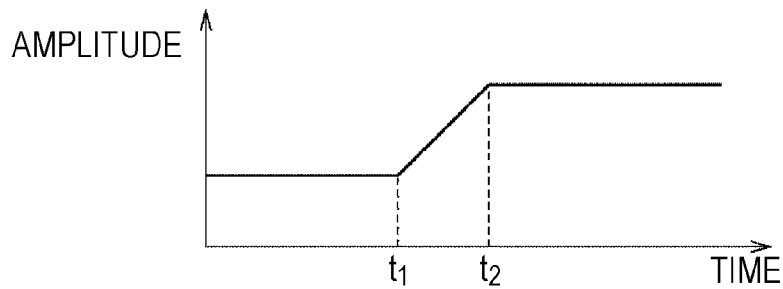
FIGS. 3A to 3C are diagrams illustrating a transient response when the gain is continuously controlled.
Figure 3B:
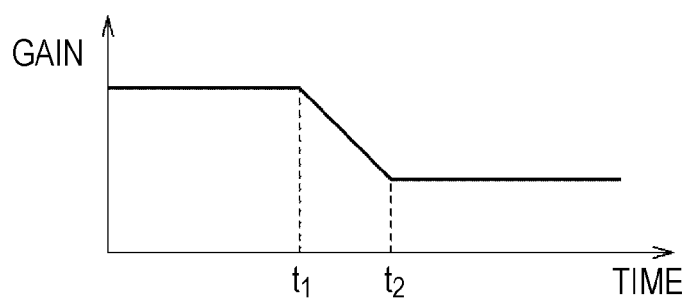
Figure 3C:
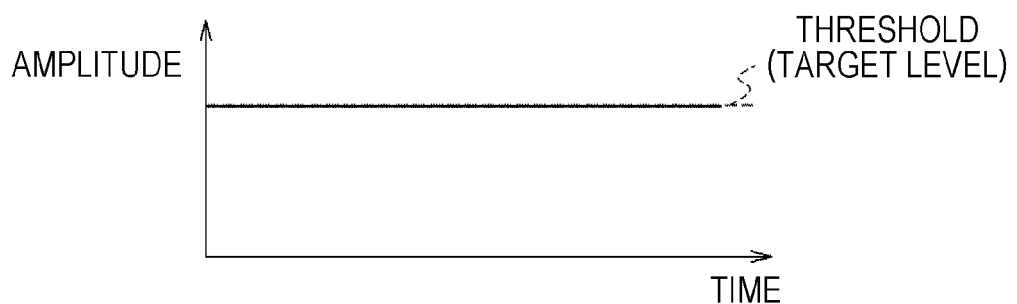

In an AGC system that continuously controls, as shown in FIGS. 3A to 3C, the gain can continuously be adjusted in an analog fashion and so a transient response of signal output when the gain changes also changes continuously. FIG. 3A is a graph showing a transient response of the signal level in analog input and the horizontal axis represents the time and the vertical axis represents the signal level. FIG. 3B is a diagram showing the transient response of gain changes in the gain variable amplifier 14 and the horizontal axis represents the time and the vertical axis represents the gain.

If, as shown in FIG. 3A, the signal level input between time t1 and time t2 continuously increases, as shown in FIG. 3B, the gain of the gain variable amplifier 14 decreases with an increasing signal level. As a result, as shown in FIG. 3C, the signal input into the demodulation unit in the subsequent stage (output from the digital gain variable amplifier 20) can maintain an almost constant value.

Thus, in the AGC system 10 shown in FIG. 1, the gain can continuously be adjusted in accordance with changes of the received signal level and therefore, the input signal level of the demodulation unit in the subsequent stage becomes approximately constant.

Figure 4A:
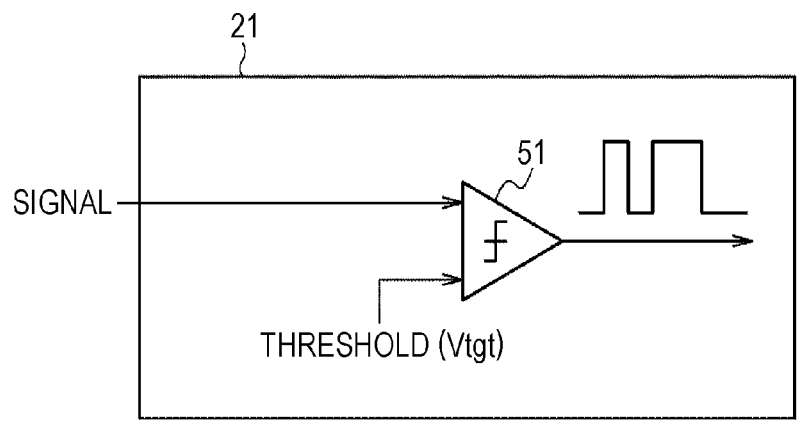
FIGS. 4A and 4B are diagrams showing the configuration of an overload detector.
Figure 4B:
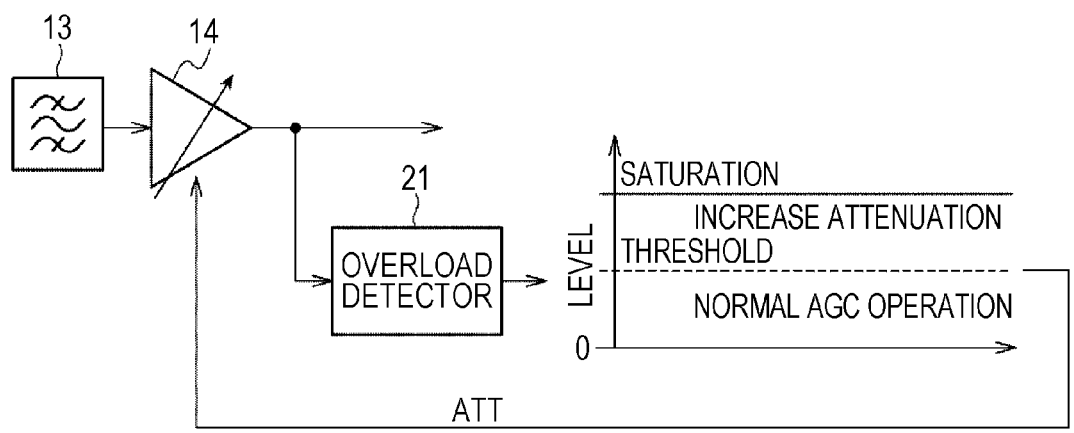

Here, the overload detector 21 will be described. FIG. 4A is a diagram showing the configuration of the overload detector 21. The overload detector 21 includes a comparator 51 and compares, as shown in FIG. 4B, a set threshold and the input signal level and outputs a detection signal. The overload detector 21 instructs the AGC unit 22 to exercise normal control when the input signal level is lower than the threshold and instructs the AGC unit 22 to increase attenuation when the input signal level is higher than the threshold.

In the AGC system 10 exercising such continuous control, analog components such as DAC, LPF, and a bias circuit are necessary for loop control and the circuit size is thereby increased and power consumption tends to increase.

In addition, to inhibit the AGC loop from becoming unstable, it is necessary to guarantee monotonous increasing/decreasing properties depending on the DC voltage by the design of the gain variable amplifier. An AGC system that takes the above into consideration and exercises discrete control will be described.

<Configuration of AGC System Controlled Discretely>

FIG. 5 is a diagram showing the configuration of an embodiment of the AGC system that exercises discrete control. In an AGC system 100 shown in FIG. 5, the same reference numerals are attached to the same units as those in the AGC system 10 shown in FIG. 1 and the description thereof is omitted.

The AGC system 100 shown in FIG. 5 includes the antenna 11, the LNA 12, the RF filter 13, a gain variable amplifier 101, the frequency conversion unit 15, the IF filter 16, the ADC unit 17, the decimation filter 18, the neighboring channel filter 19, the digital gain variable amplifier 20, an overload detector 102, and an AGC unit 103.

In the AGC system 100 that exercises discrete control, the gain variable amplifier 101 exercises discrete control. A configuration that does not include the PWM filter 23 (FIG. 1) can be adopted by discrete processing being performed by the gain variable amplifier 101. The AGC system 100 can adopt a configuration from which the PWM filter 23 is removed and therefore, it becomes possible to shrink the circuit size and reduce power consumption.

Also, the overload detector 102 that issues instructions to the AGC unit 103 based on a signal from the gain variable amplifier 101 that exercises discrete control is configured differently from the overload detector 21 of the AGC system 10 shown in FIG. 1 and thus, the description thereof will continue by attaching a different reference numeral.

Figure 6A:
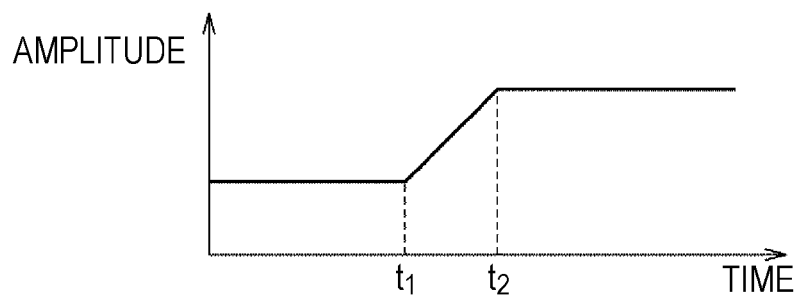
FIGS. 6A to 6C are diagrams illustrating the transient response when the gain is discretely controlled.
Figure 6B:
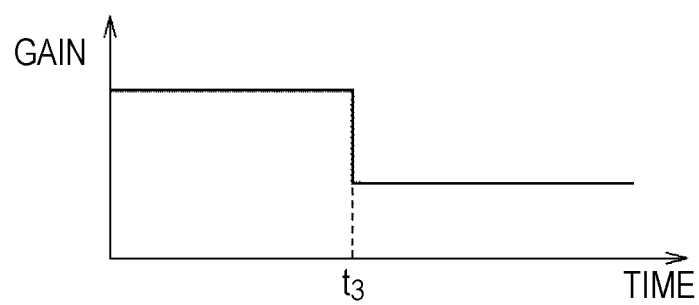
Figure 6C:
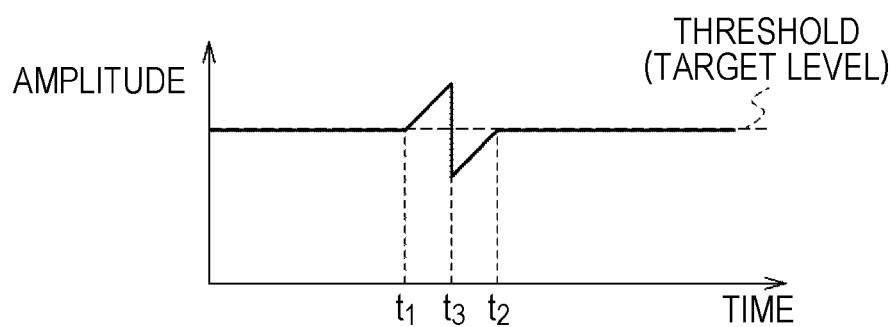

A transient response in the AGC system 100 that allows the gain to be controlled discretely in an analog fashion will be described with reference to FIGS. 6A to 6C. FIGS. 6A to 6C correspond to the diagram illustrating the transient response in the AGC system 10 shown in FIGS. 3A to 3C and FIG. 6A shows the same graph as that in FIG. 3A.

As shown in FIG. 6A, if the input signal level continuously increases between time t1 and time t2, the gain of the gain variable amplifier 101 changes as shown in FIG. 6B in response to the change thereof. Because the gain variable amplifier 101 changes the gain discretely, the gain is changed when the input level exceeds a threshold.

In the example shown in FIG. 6B, the input level exceeds the threshold at time t3 and the gain is changed. As a result, as shown in FIG. 6C, the input into the demodulation unit in the subsequent stage (output from the digital gain variable amplifier 20) becomes a signal whose level rises from time t1 to time t3, falls steeply at time t3, and then rises till time t2.

Thus, in the AGC system 100 that exercises discrete control, the gain changes discretely and so the transient response of the signal output when the gain changes may be steep.

Figure 7:
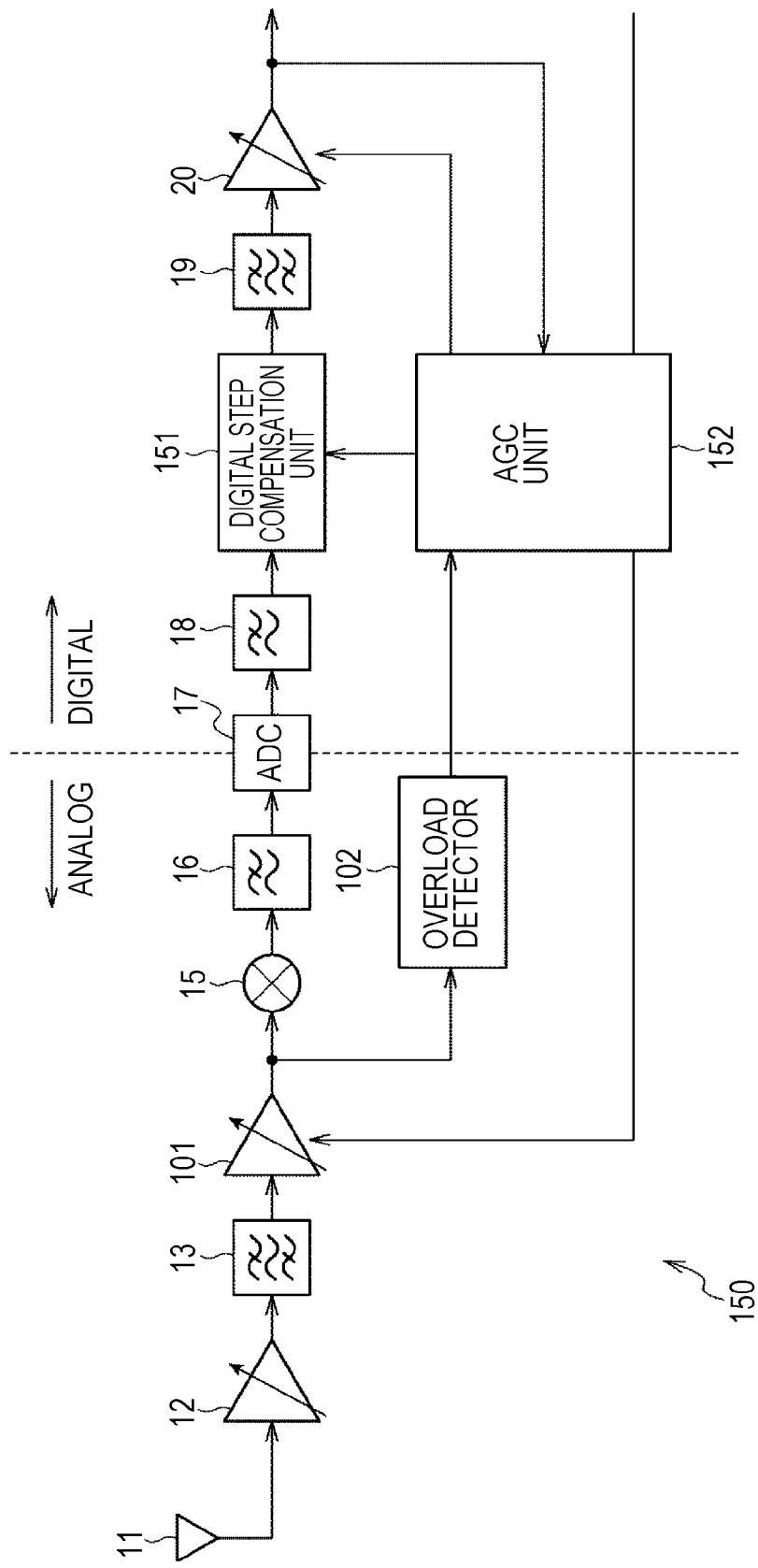
FIG. 7 is a diagram showing another configuration of an embodiment of the AGC system to which the present technology is applied.

Thus, the digital section is given a function that, even when a steep change occurs in the analog section, absorbs the change. FIG. 7 is a diagram showing the configuration of the AGC system in which the function to absorb a steep change that occurs in the analog section is given to the digital section.

In an AGC system 150 shown in FIG. 7, the same reference numerals are attached to the same units as those in the AGC system 100 shown in FIG. 5 and the description thereof is omitted. The AGC system 150 shown in FIG. 7 is obtained by providing a digital step compensation unit 151 in the AGC system 100 shown in FIG. 5. The digital step compensation unit 151 performs processing to interpolate a discrete gain change in the analog section based on instructions from an AGC unit 152.

Figure 8A:
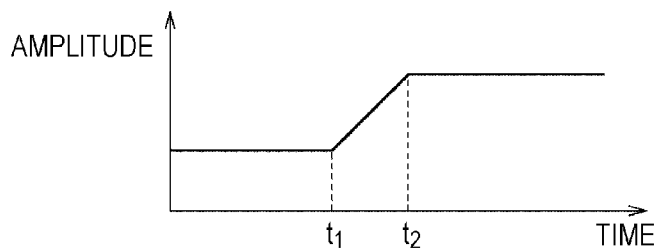
FIGS. 8A to 8E are diagrams illustrating the transient response when the gain is discretely controlled.
Figure 8B:
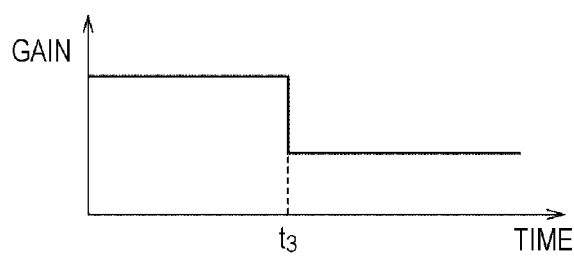
Figure 8C:
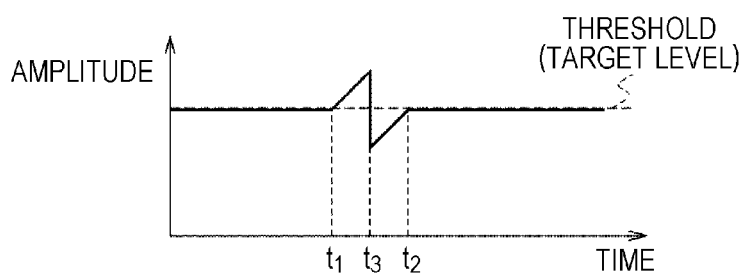

The transient response in the AGC system 150 that allows discrete gain control in an analog fashion and interpolates a discrete gain change in the analog section will be described with reference to FIGS. 8A to 8E. FIGS. 8A to 8C are the same graphs as those in FIGS. 6A to 6C. If, as shown in FIG. 8A, the input signal level increases continuously between time t1 and time t2, the gain of the gain variable amplifier 101 changes as shown in FIG. 8B in accordance with changes thereof and thus, the output from the analog section becomes, as shown in FIG. 8C, a signal whose level rises from time t1 to time t3, falls steeply at time t3, and then rises till time t2.

Figure 8D:
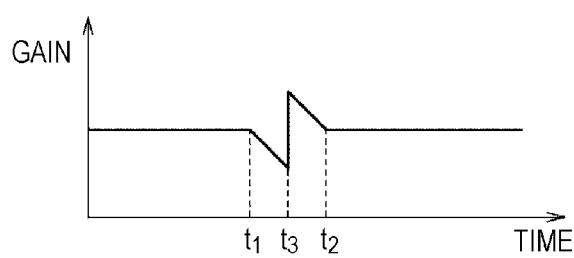
Figure 8E:
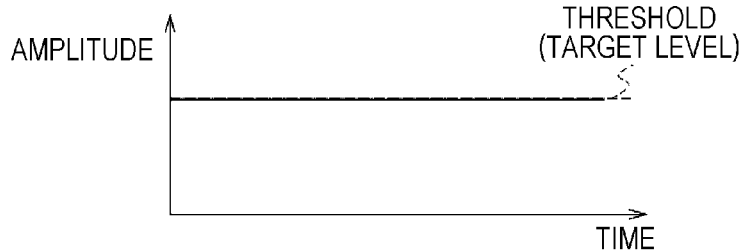

To convert such a signal into a signal having a constant level as shown in FIG. 8E, the digital step compensation unit 151 makes compensation as shown in FIG. 8D. That is, as shown in FIG. 8D, the digital step compensation unit 151 controls the gain such that the gain continuously decreases from time t1 to time t3, steeply increases at time t3, and then continuously decreases from time t3 to time t2.

As shown in FIG. 8D, a signal having a constant level can be supplied to the demodulation unit (not shown) in the subsequent stage of the AGC system 150 by the above control being exercised by the digital step compensation unit 151.

Thus, when the analog section that processes an acquired signal in an analog fashion adjusts the gain discretely, the digital section that digitally processes a signal processed by the analog section performs processing to compensate for adjustments of the discrete gain by the analog section. That is, the digital step compensation unit 151 makes continuous gain adjustments to interpolate discrete gain changes in the analog section.

The digital step compensation unit 151 also compensates for discrete gain adjustments in the analog section by responding to a transient step in which the gain changes steeply in the analog section to compensate with inverse characteristics of the transient response. The digital step compensation unit 151 that makes such adjustments preferably makes gain adjustments in a smaller width than the width of the gain achieved in the analog section.

<Another Configuration of AGC System Controlled Discretely>

Figure 9:
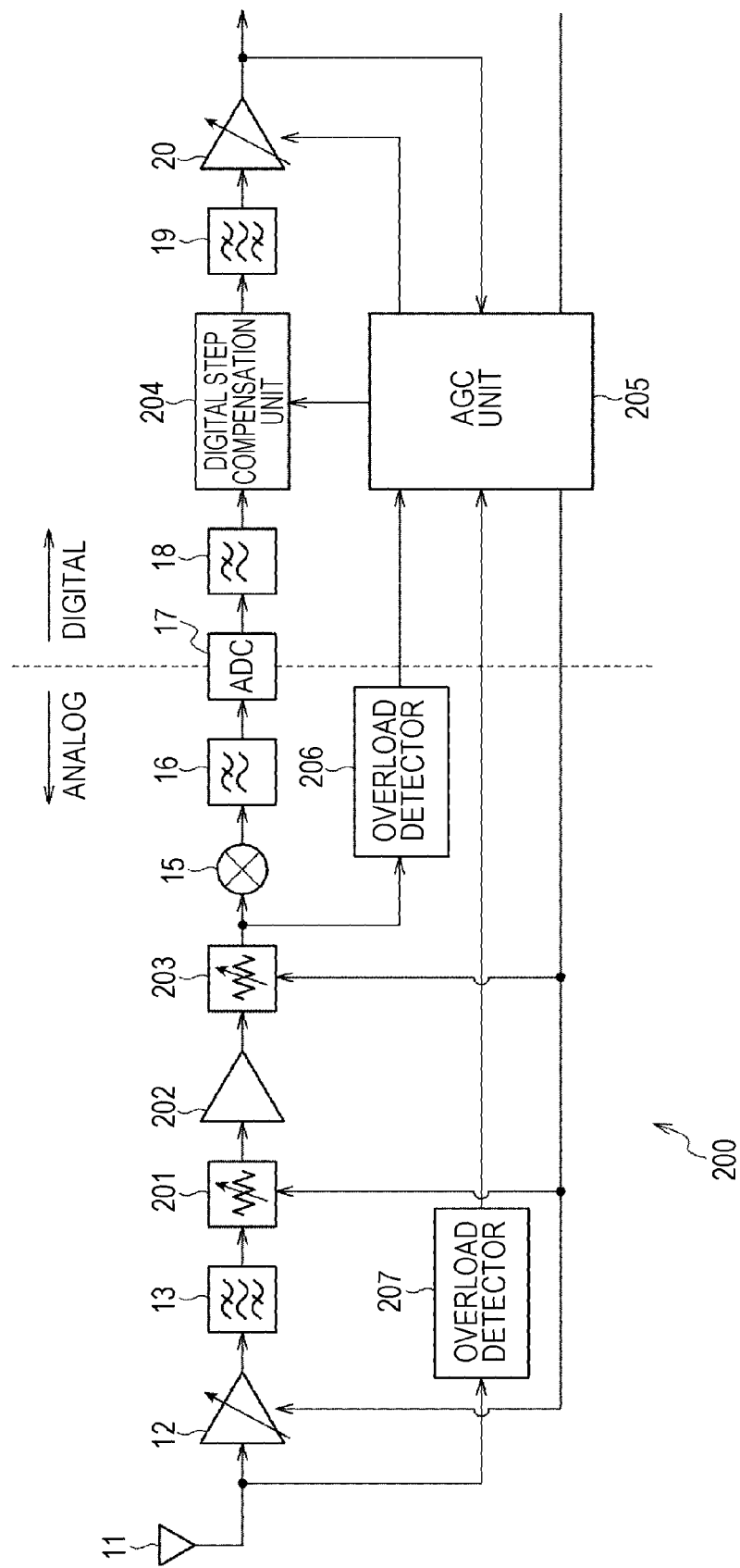
FIG. 9 is a diagram showing still another configuration of an embodiment of the AGC system to which the present technology is applied.

The configuration of another embodiment of the AGC system that exercises discrete control is shown in FIG. 9. In an AGC system 200 shown in FIG. 9, the same reference numerals are attached to the same units as those in the AGC system 150 shown in FIG. 7 and the description thereof is omitted.

The AGC system 200 shown in FIG. 9 includes the antenna 11, the LNA 12, the RF filter 13, the frequency conversion unit 15, the IF filter 16, the ADC unit 17, the decimation filter 18, the neighboring channel filter 19, and the digital gain variable amplifier 20. The AGC system 200 shown in FIG. 9 also includes a first variable attenuator 201, a gain fixed amplifier 202, and a second variable attenuator 203 between the RF filter 13 and the frequency conversion unit 15. Then, an overload detector 206 and an overload detector 207 are included in the analog section.

The gain fixed amplifier 202 is an amplifier to amplify the received signal level and is an amplifier that maintains the gain constant without making the gain variable. The first variable attenuator 201 is a variable attenuator positioned prior to the gain fixed amplifier 202 and discretely attenuates the signal level based on a control signal from an AGC unit 205. The second variable attenuator 203 is a variable attenuator positioned subsequent to the gain fixed amplifier 202 and discretely attenuates the signal level based on a control signal from the AGC unit 205.

The description continues here by taking a case in which two variable attenuators are included as an example, but a configuration in which more than two variable attenuators are included can also be adopted. Also, even if a plurality of variable attenuators is included, the gain control described below can be applied to each variable attenuator.

The description continues here by assuming that a portion functioning as an adjustment unit that adjusts the gain in the analog section includes the LNA 12, the first variable attenuator 201, and the second variable attenuator 203.

A digital step compensation unit 204 is configured so as to compensate for discrete changes of the signal level caused by an operation of the LNA 12, the first variable attenuator 201, or the second variable attenuator 203 in the analog section or a step response on the time axis. The AGC unit 205 controls the LNA 12, the first variable attenuator 201, the second variable attenuator 203, and the digital step compensation unit 204 based on an output signal from each of the overload detector 206 and the overload detector 207, an output from the digital gain variable amplifier 20, and a signal from the demodulation unit (not shown) in the subsequent stage.

The overload detector 206 and the overload detector 207 are circuits for detecting a disturbing wave that degrades received signal quality and also are circuits configured not to be detected by a received signal because the disturbing wave signal level to be detected is sufficiently higher than that of a received signal. The overload detector 206 and the overload detector 207 have the same configuration, but different values are set as respective thresholds.

In the AGC system 200 having the above configuration to exercise discrete control, an analog component (for example, the PWM filter 23) necessary in the AGC system 100 (FIG. 1) that exercises continuous control can be eliminated by changing a gain variable amplifier to a circuit of a fixed amplifier and variable attenuators and digitizing analog control. As a result, the circuit size and power consumption can be reduced.

<Configuration of Overload Detector>

In the AGC system 150 shown in FIG. 7 or the AGC system 200 shown in FIG. 9, the analog section discretely controls the gain and thus, a variable attenuator, for example, the gain variable amplifier 101 (FIG. 7) or the first variable attenuator 201 (FIG. 9) may operate at all times at a signal level near a threshold of, for example, the overload detector 102 (FIG. 7) or the overload detectors 206, 207 (FIG. 9), leading to an oscillation.

Such an oscillation will be described with reference to FIGS. 4A and 4B again. FIGS. 4A and 4B are diagrams illustrating the configuration and operation of the overload detector 21 of the AGC system 100 that exercises continuous control. In the AGC system 100 that exercises continuous control, the gain changes continuously and when the overload detector 21 operates, the value of gain converges and stabilizes such that the signal level near the threshold thereof is reached.

However, if, as shown in FIG. 4A, the overload detector 21 is configured by the one comparator 51 and, as shown in FIG. 4B, processing is performed by provided one threshold and if such a configuration is applied to the overload detector 102 (FIG. 7) of the AGC system 100 that exercises discrete control or the overload detectors 206, 207 (FIG. 9) of the AGC system 150, the oscillation as described below may occur.

The description continues here by taking a case in which the configuration shown in FIG. 4A is applied to the overload detector 102 shown in FIG. 7 and the operation shown in FIG. 4B is performed as an example. The processing performed by the AGC unit 152 is different depending on whether or not the threshold set to the overload detector 102 is exceeded and, as a result, the gain of the gain variable amplifier 101 is switched. When switching of the gain occurs, the gain is switched discretely and thus, the change of the gain near the threshold is large.

Thus, the resultant change of gain of the gain variable amplifier 101 when, for example, a signal of the signal level near the threshold set to the overload detector 102 is processed becomes large and the gain continues to change by the step in the operation period of AGC, which may cause an oscillation. Such an oscillation may also occur in the AGC system 200 shown in FIG. 9.

Figure 10A:
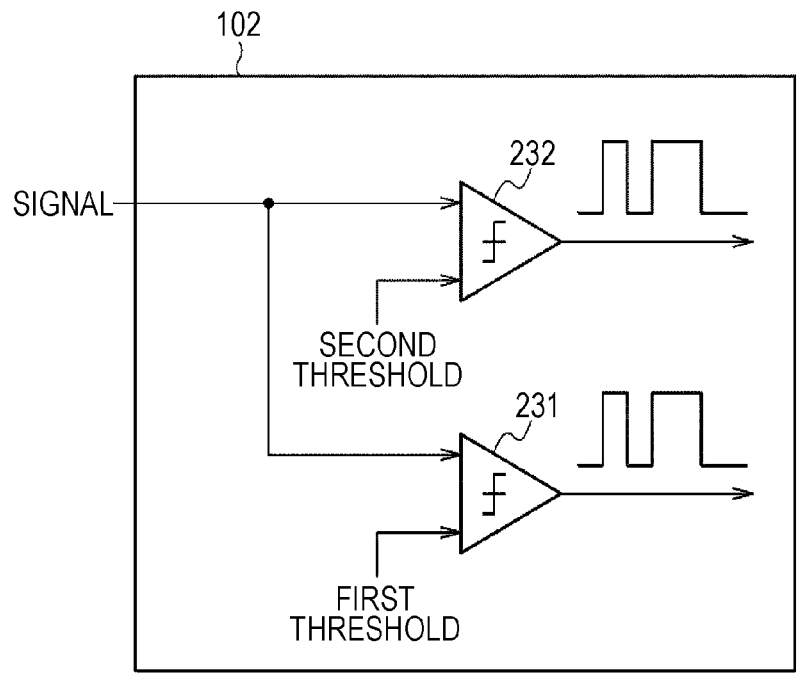
FIGS. 10A and 10B are diagrams showing the configuration of the overload detector.
Figure 10B:
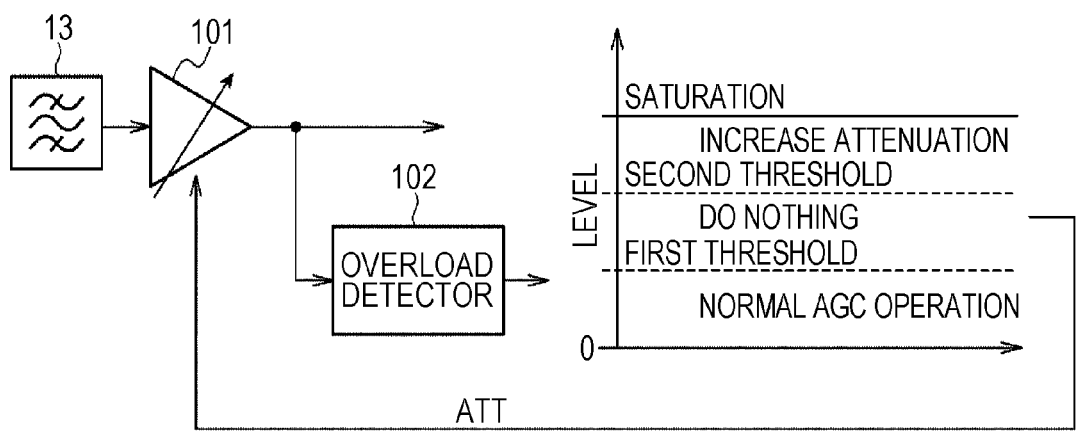

Thus, to prevent the gain variable amplifier 101 from oscillating even when a signal of the signal level near the threshold set to the overload detector 102 is processed, the overload detector 102 is configured as shown in FIG. 10A such that the operation as shown in FIG. 10B is performed.

Referring to FIG. 10A, the overload detector 102 includes two comparators, a comparator 231 and a comparator 232. The comparator 231 compares the level of an input signal and a first threshold and outputs the comparison result. The comparator 232 compares the level of an input signal and a second threshold and outputs the comparison result. The AGC unit 152 is instructed to exercise normal control when the level of the input signal is equal to or less than the first threshold and the AGC unit 152 is instructed to increase the attenuation when the level of the input signal is equal to or more than second threshold. When the input level is larger than the first threshold and smaller than the second threshold, the AGC unit 152 is instructed to maintain the control at that time.

Thus, an oscillation can be avoided by setting the first threshold and the second threshold and also setting a dead band. That is, if, for example, the signal level is in the dead band between the first threshold and the second threshold, a state in which the gain continues to change by the step does not arise so that circumstances in which the gain stabilizes and an oscillation occurs can be avoided.

Thus, when the first threshold and the second threshold are set, it is preferable to set the level width (difference between the first threshold and the second threshold) to equal to or more than the step width of the gain that discretely changes to avoid an oscillation.

Here, an oscillation has been described by taking the overload detector 102 of the AGC system 150 shown in FIG. 7 as an example, but can also be described by being applied to one or both of the overload detector 206 and the overload detector 207 shown in FIG. 9.

When applied to both of the overload detector 206 and the overload detector 207 shown in FIG. 9, two thresholds set to the overload detector 206 and two thresholds set to the overload detector 207 can be made different thresholds.

<Control Using Hysteresis>

Next, the control using hysteresis will be described. In the AGC system 150 or the AGC system 200 that exercises discrete control, as described above, the gain may frequently be switched by the discrete gain control in the analog section, leading to an oscillation.

Thus, next, the configuration of the AGC unit that prevents frequent switching of the gain to prevent an oscillation by performing processing using hysteresis in the AGC unit 152 (FIG. 7) or the AGC unit 205 (FIG. 9) will be described.

Figure 11:
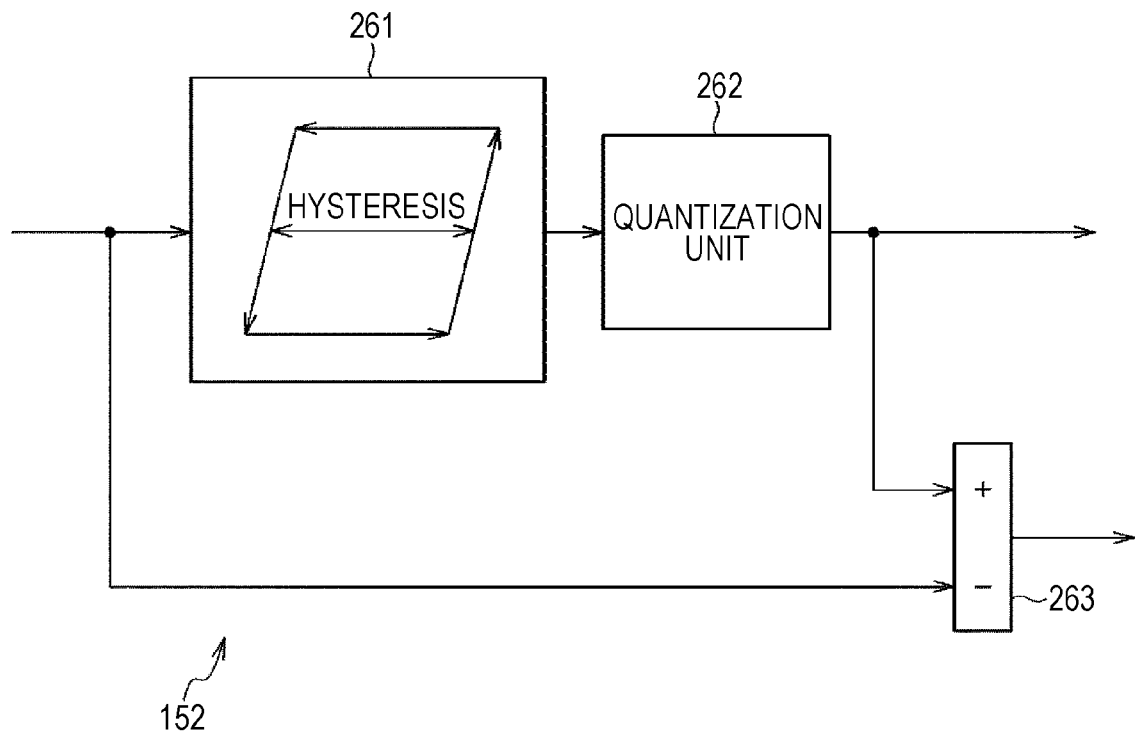
FIG. 11 is a diagram illustrating the configuration of an AGC unit.

FIG. 11 is a diagram showing a configuration example of the AGC unit 152 of the AGC system 150 shown in FIG. 7. The AGC unit 152 shown in FIG. 11 includes a hysteresis processing unit 261, a quantization unit 262, and an operation unit 263.

Thus, by applying hysteresis by the hysteresis processing unit 261 before quantization processing by the quantization unit 262 to generate each AGC control signal in the AGC unit 152, control events that could cause signal degradation can be reduced to stabilize control. In addition, by adjusting the hysteresis width, the tradeoff between stability of an AGC loop and the dynamic range of the system can be adjusted.

A control event is, for example, an occurrence of gain switching and a control event that could cause signal degradation is, for example, a frequent occurrence of the above gain switching.

In the AGC unit 152 shown in FIG. 11, hysteresis processing is performed on an input signal by the hysteresis processing unit 261 and the result is supplied to the quantization unit 262 for quantization. The quantized signal is supplied to the gain variable amplifier 101 to be used for gain control. The quantized signal is also supplied to the operation unit 263.

The input signal is also supplied to the operation unit 263. The operation unit 263 operates a difference between the input signal and the quantized signal and supplies the operation result to the digital step compensation unit 151. That is, a signal from the operation unit 263 is supplied to the digital step compensation unit 151 to make gain adjustments that are difficult to compensate for by gain adjustments in the analog section by the digital step compensation unit 151. Incidentally, if the hysteresis processing unit 261 is not provided in the AGC unit 152, the input signal is supplied to the quantization unit 262 to be quantized and the quantized signal is supplied to the gain variable amplifier 101. In this case, if the input signal at the signal level near switching of the gain of the gain variable amplifier 101, a signal in accordance with such a signal level is generated by the AGC unit 152 and supplied to the gain variable amplifier 101. In such a case, switching of the gain by the gain variable amplifier 101 may occur frequently, leading to an oscillation.

Figure 12:
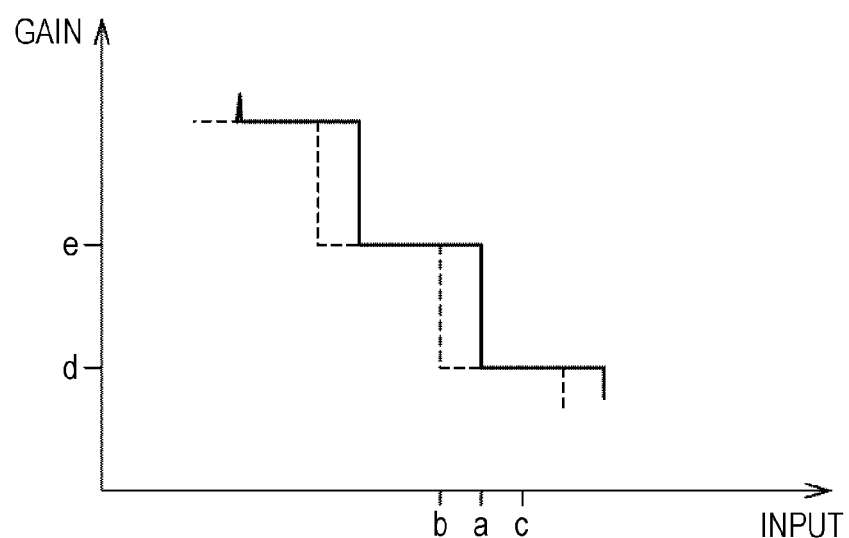
FIG. 12 is a diagram illustrating hysteresis.

By performing hysteresis processing by the hysteresis processing unit 261 on the input signal, the gain variable amplifier 101 can be prevented from oscillating. FIG. 12 is a diagram illustrating hysteresis processing by the hysteresis processing unit 261. In the graph shown in FIG. 12, the horizontal axis represents the level of an input signal and the vertical axis represents the value of gain output to the gain variable amplifier 101. The graph shown by a solid line in FIG. 12 is a graph of the gain set when the level of an input signal rises and the graph shown by a dotted line is a graph set when the level of an input signal falls.

If, for example, the level of an input signal rises from level b to level a, the gain is switched from gain e to gain d. If the level of an input signal falls from level a to level b, the gain remains gain d. Further, if the level of an input signal rises from level b to level a when the gain is gain d, the gain remains gain d.

Thus, even if the level of an input signal frequently changes from level a to level b or from level b to level a, the gain remains gain d and therefore, the gain of the gain variable amplifier 101 is not switched and conditions in which an oscillation occurs can be prevented from arising.

Figure 13:
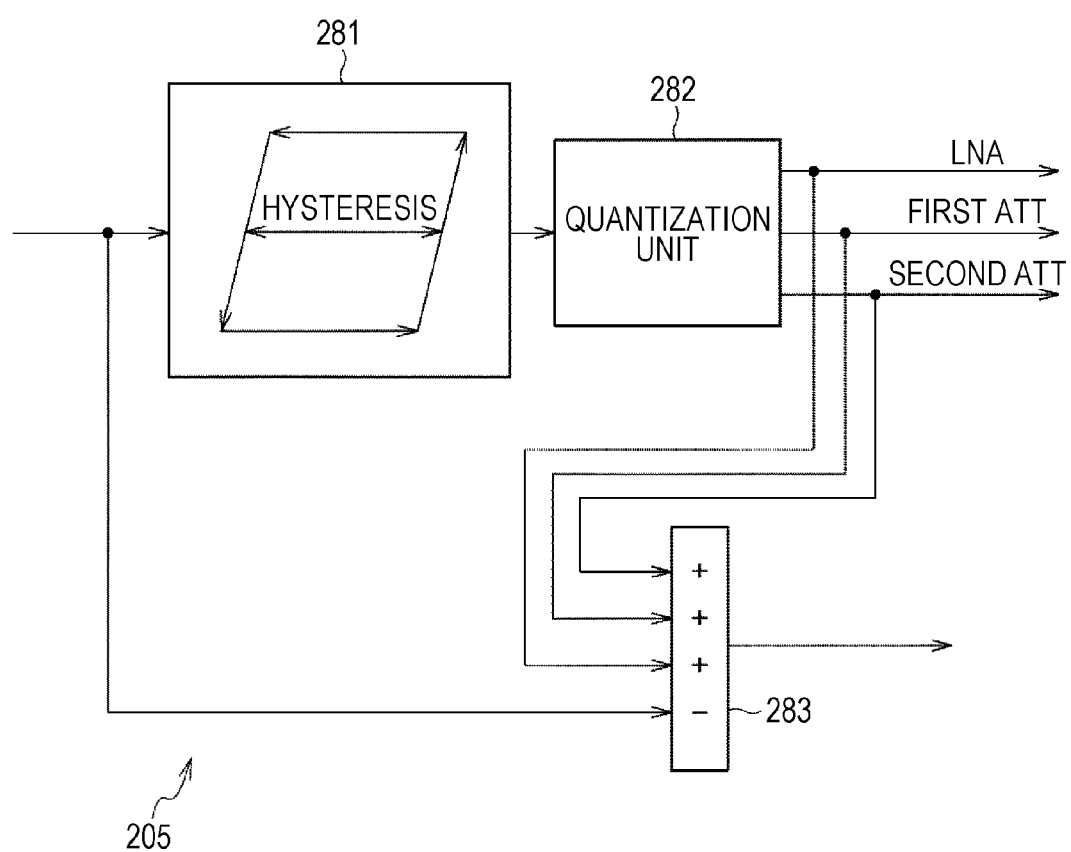
FIG. 13 is a diagram illustrating the configuration of the AGC unit.

FIG. 13 is a diagram showing a configuration example of the AGC unit 205 of the AGC system 200 shown in FIG. 9. The AGC unit 205 shown in FIG. 13 includes a hysteresis processing unit 281, a quantization unit 282, and an operation unit 283.

The configuration of the AGC unit 205 shown in FIG. 13 is basically the same as the configuration of the AGC unit 152 shown in FIG. 11, but is different in that a plurality of signals is output from the quantization unit 282. That is, the quantization unit 282 is configured to generate and output each of a signal to control the LNA unit 12, a signal to control the first variable attenuator 201, and a signal to control the second variable attenuator 203.

The operation unit 283 is configured to input these three control signals and an input signal input into the AGC unit 205 itself and to generate a control signal to the digital step compensation unit 204 by subtracting the value of the input signal from the value obtained by adding the three signals from the quantization unit 282. Also in this case, the hysteresis processing unit 281 performs processing as described with reference to FIG. 12 such that the gain is not frequently switched even if the level of the input signal flops.

Thus, also in this case, each of the LNA 12, the first variable attenuator 201, and the second variable attenuator 203 can be controlled so as to prevent frequent switching of the gain from occurring and by extension, an oscillation from occurring.

Thus, by making a change of the gain when the level of an input signal rises and a change of the gain when the level falls different changes in the AGC unit 152 and the AGC unit 205, frequent switching of the gain can be prevented from occurring in the analog section and an oscillation can be prevented from occurring.

Incidentally, the AGC unit 152 and the AGC unit 205 may be configured as described with reference to FIGS. 11 to 13 and the overload detectors 102, 206, 207 may be configured as described with reference to FIGS. 10A and 10B. That is, the AGC unit and the overload detector described above are technologies that can be made to coexist in one AGC system.

<Correction of Non-Uniform Step Width>

In an AGC system in which discrete control is exercised, the step width of the gain of the LNA 12 or the first variable attenuator 201 may be non-uniform between individual units or between steps due to variations of analog elements.

Also in the digital step compensation of the digital step compensation units 151, 204, if the analog step width becomes non-uniform and a difference arises from an ideal step, the difference may affect demodulation processing of the demodulation unit in the subsequent stage as a compensation error.

The compensation of a non-uniform step width using LUT (Look-Up-Table) to prevent such a difference will be described.

Figure 14:
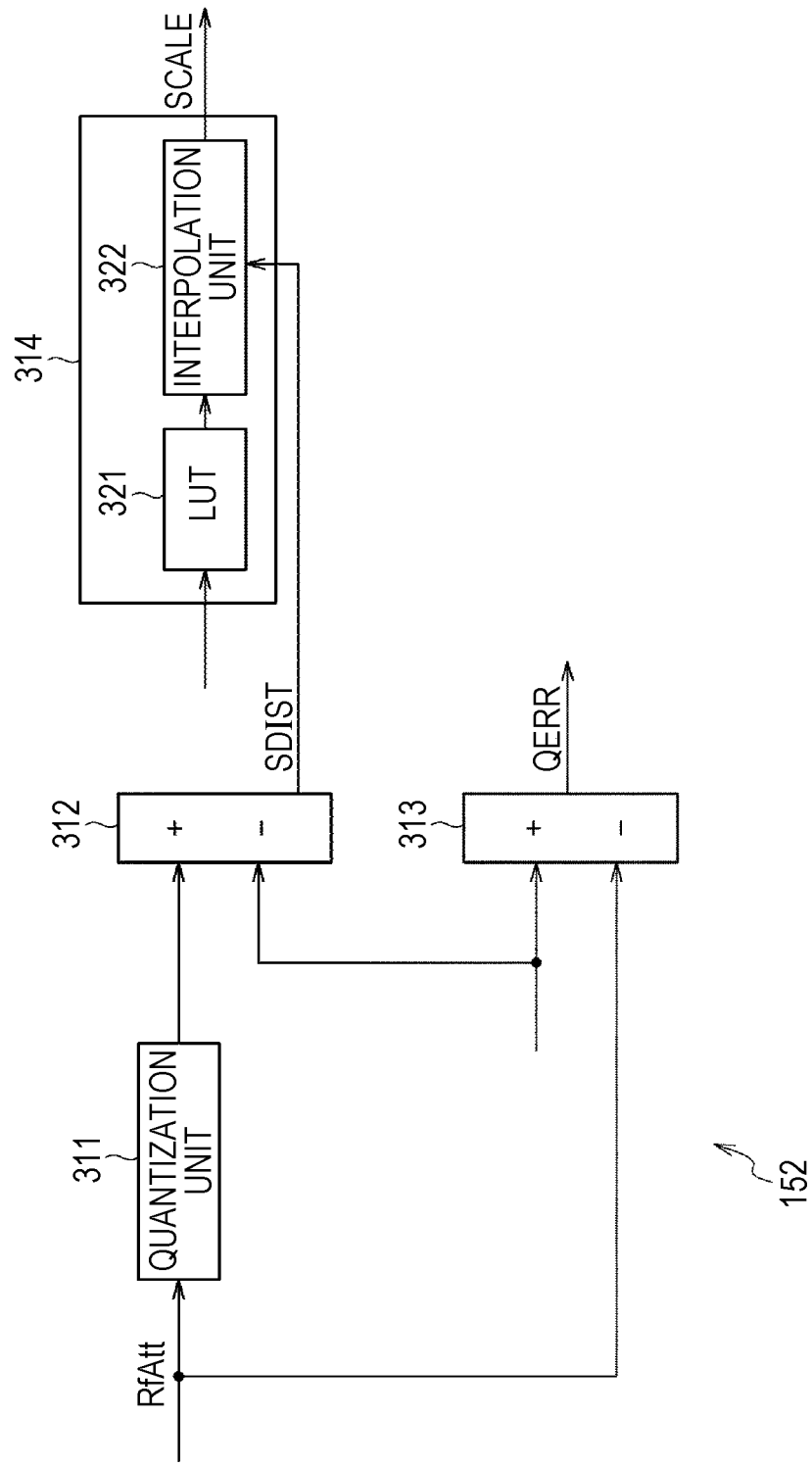
FIG. 14 is a diagram illustrating the configuration of the AGC unit.

FIG. 14 is a diagram showing a configuration example of the AGC unit 152 of the AGC system 150 shown in FIG. 7. The AGC unit 152 shown in FIG. 14 includes a quantization unit 311, an operation unit 312, an operation unit 313, and an interpolation processing unit 314. The interpolation processing unit 314 includes an LUT 321 and an interpolation unit 322.

Information (RfAtt) representing attenuation in the analog section is input into the quantization unit 311 and the information is supplied to the operation unit 312 after being quantized. Gain information of the gain variable amplifier 101 is also input into the operation unit 312 and a difference between the gain of the gain variable amplifier 101 and the attenuation in the analog section is operated by the operation unit 312 and is output to the interpolation processing unit 314 as SDIST. SDIST is a normalized value of a quantity up to the step operation.

The gain information of the gain variable amplifier 101 is input into the LUT 321 of the interpolation processing unit 314 and a value associated with the gain is read supplied to the interpolation unit 322. The interpolation unit 322 calculates an interpolation value from the value from the LUT 321 and SDIST and outputs the interpolation value to the digital step compensation unit 151 as SCALE. SCALE is a signal representing the real step width.

Values described in the LUT 321 are discrete and the discrete values are interpolated by the interpolation unit 322 to generate and output a signal representing the real step width.

On the other hand, information representing attenuation in the analog section and the gain information of the gain variable amplifier 101 are supplied to the operation unit 313 to operate a difference therebetween. The difference is supplied to the digital step compensation unit 151 as QERR. QERR is a normalized value of a quantization error.

Thus, a value called SCALE and a value called QERR are calculated in the AGC unit 152 and supplied to the digital step compensation unit 151. Detailed processing of each unit will be described by taking the AGC unit 205 of the AGC system 200 having basically the same configuration and shown in FIG. 9 as an example.

Figure 15:
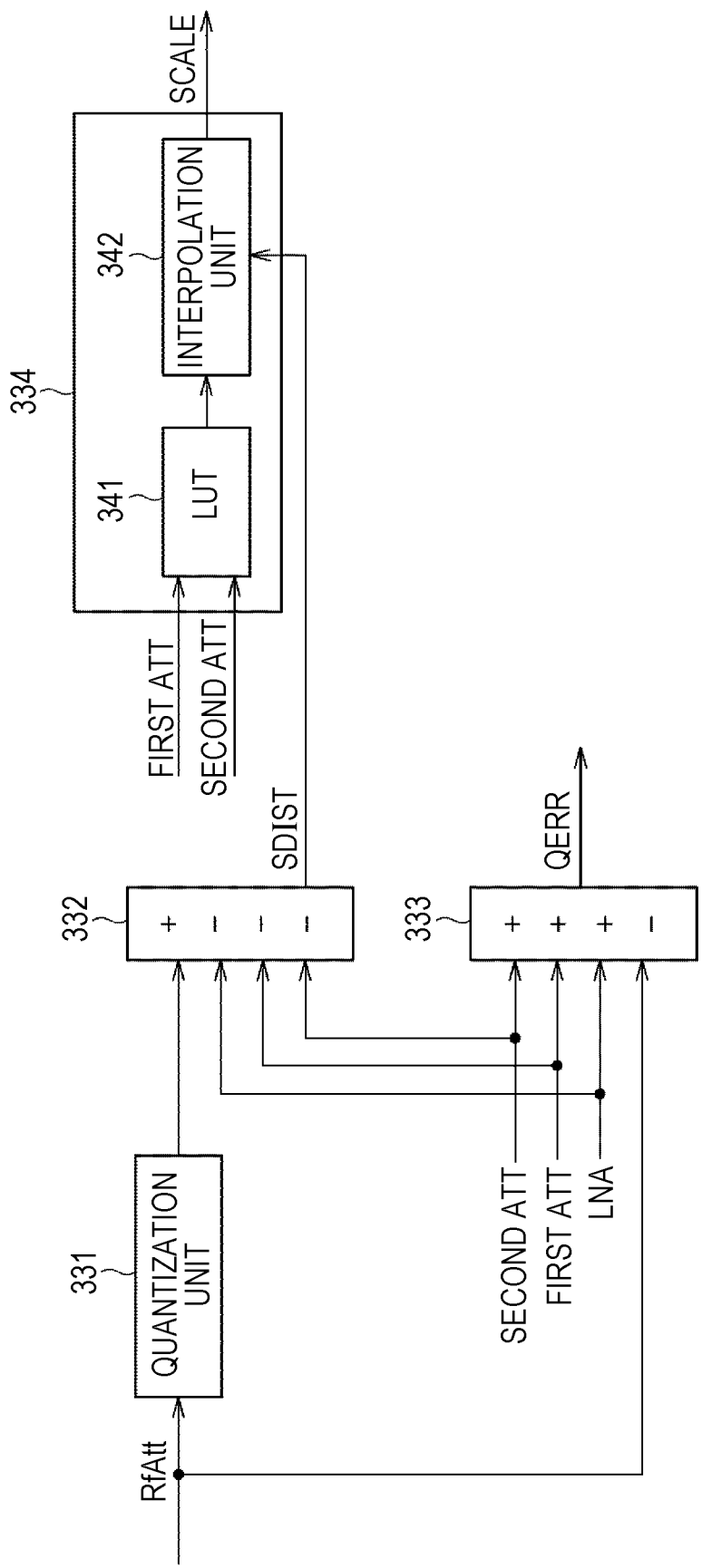
FIG. 15 is a diagram illustrating the configuration of the AGC unit.

FIG. 15 is a diagram showing the configuration of the AGC unit 205 of the AGC system 200 shown in FIG. 9. The AGC unit 205 shown in FIG. 15 includes a quantization unit 331, an operation unit 332, an operation unit 333, and an interpolation processing unit 334. The interpolation processing unit 334 includes an LUT 341 and an interpolation unit 342.

Information (RfAtt) representing attenuation in the analog section is input into the quantization unit 331 and the information is supplied to the operation unit 332 after being quantized. Gain information of each of the LNA 12, the first variable attenuator 201, and the second variable attenuator 203 is also input into the operation unit 332 and differences between these gains and attenuation in the analog section are calculated by the operation unit 332 and output the differences to the interpolation processing unit 334 as SDIST.

The gain information of each of the first variable attenuator 201 and the second variable attenuator 203 is input into the LUT 341 of the interpolation processing unit 334 and values associated with the gains are read and supplied to the interpolation unit 342. The interpolation unit 342 calculates an interpolation value from a value from the LUT 341 and SDIST and outputs the interpolation value to the digital step compensation unit 204 as SCALE.

On the other hand, information (RfAtt) representing attenuation in the analog section and the gain information of each of the LNA 12, the first variable attenuator 201, and the second variable attenuator 203 are supplied to the operation unit 333 to operate differences therebetween. The differences are supplied to the digital step compensation unit 204 as QERR.

Figure 16:
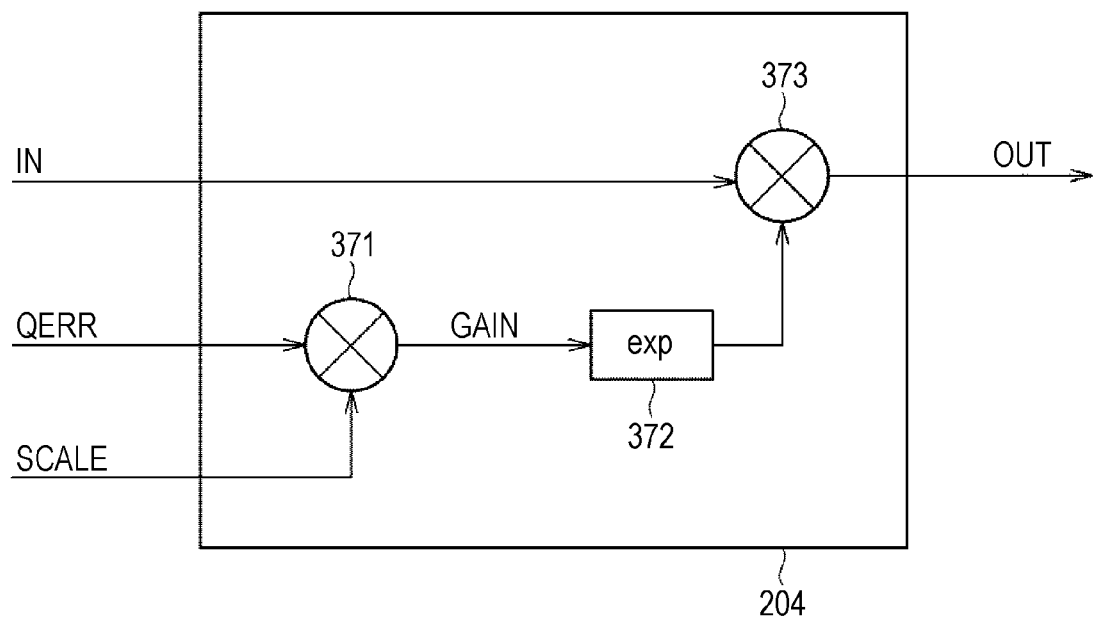
FIG. 16 is a diagram illustrating the configuration of a digital step compensation unit.

Thus, a value called SCALE and a value called QERR are calculated in the AGC unit 205 and supplied to the digital step compensation unit 204. FIG. 16 shows a configuration example of the digital step compensation unit 204 to which a value called SCALE and a value called QERR are supplied.

FIG. 16 is a diagram showing a configuration example of the digital step compensation unit 204. The digital step compensation unit 204 shown in FIG. 16 is configured to include a multiplication unit 371, an exponential function unit 372, and a multiplication unit 373.

A value called SCALE and a value called QERR from the AGC unit 205 are supplied to the multiplication unit 371 of the digital step compensation unit 204. The multiplication unit 371 multiplies values of SCALE and QERR to calculate a gain of the digital step compensation unit 204. The calculated gain is supplied to the multiplication unit 373 after an operation of a predetermined exponential function being performed by the exponential function unit 372 thereon.

A signal (input signal input into the AGC system 200, processing by the analog section being performed thereon, and digitized) from the decimation filter 18 is also input into the multiplication unit 373. The multiplication unit 373 multiplies the input signal by a value from the exponential function unit 372 and outputs the obtained value to the neighboring channel filter 19 (FIG. 9) in the subsequent stage.

Thus, compensation of the digital step compensation unit 204 is made based on a value called SCALE and a value called QERR calculated by the AGC unit 205. That is, the gain to be compensated for by the digital step compensation unit 204 is calculated based on SCALE representing the real step width and QERR obtained by normalizing a quantization error and the compensation is made by the calculated gain being added to an input signal.

Incidentally, the LUT 341 is referred to when the value of SCALE representing the real step width is calculated and the LUT 341 needs to store the value of SCALE of each step.

Figure 17:
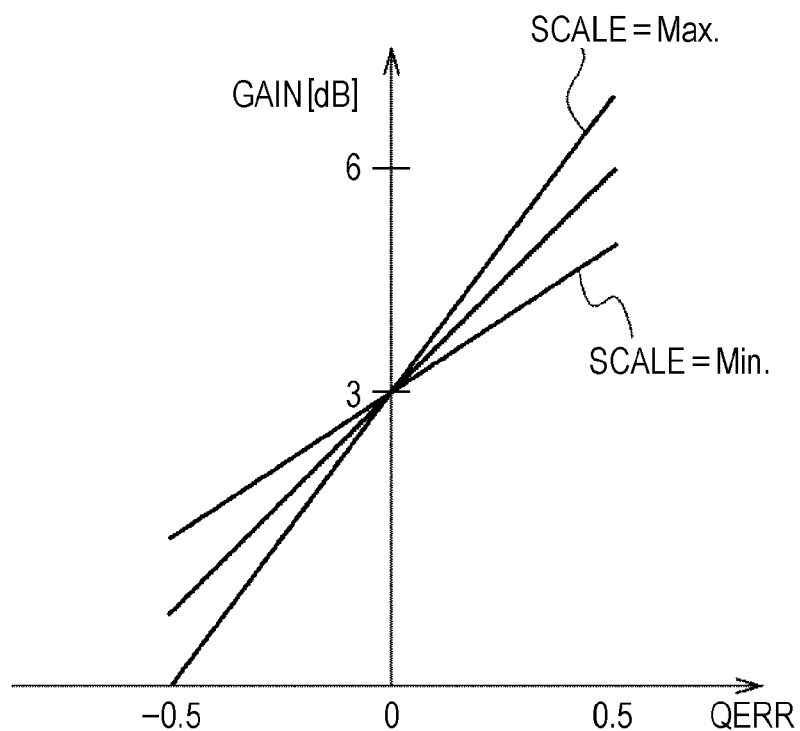
FIG. 17 is a diagram illustrating a gain step width.

As shown in FIG. 17, the step width of the digital step compensation unit 204 changes depending on the value of SCALE and thus, the LUT 341 that compensates for non-uniform widths needs to store the value of SCALE of each step.

As the circuit configuration, however, instead of storing SCALE itself, an error from the ideal step width may be stored in the LUT 341 so that SCALE is calculated by adding the ideal step width in processing in the subsequent stage.

Figure 18:
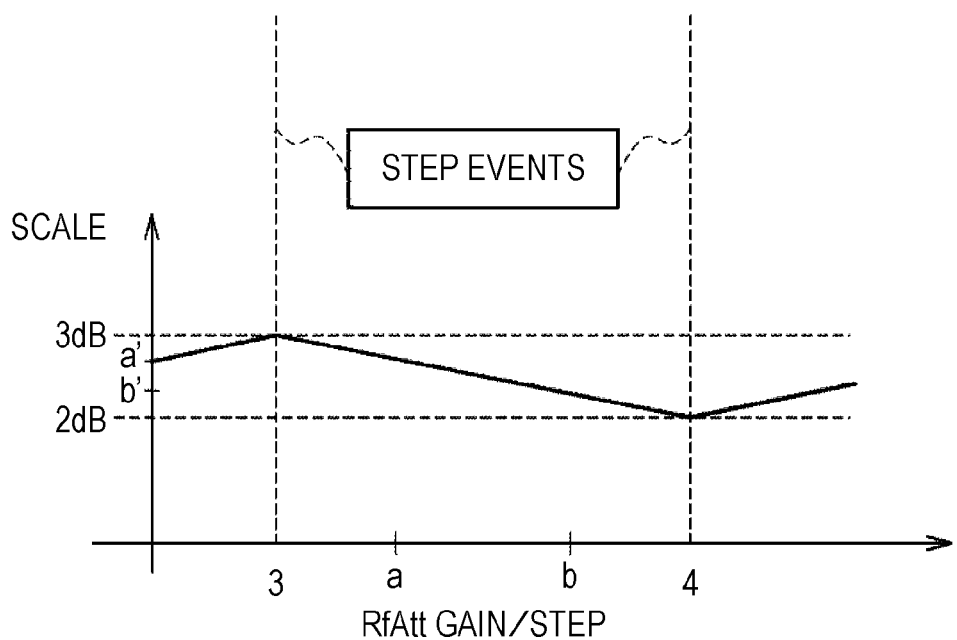
FIG. 18 is a diagram illustrating a SCALE signal.

When calculating SCALE by referring to the LUT 341, as shown in FIG. 15, the interpolation processing unit 334 interpolates SCALE between steps by using SDIST. This will be described with reference to FIG. 18. An example of SCALE interpolated between steps is shown in FIG. 18. The graph shown in FIG. 18 is a graph showing the relationship between the step and SCALE. In the graph shown in FIG. 18, the position denoted as Step events is a position where the gain is switched. Referring to the graph shown in FIG. 18, for example, when the value of RfAtt is 3, SCALE can be read to be 3 and when the value of RfAtt is 4, SCALE can be read to be 2.

As has been described with reference to FIG. 15, gain information of each of the first variable attenuator 201 and the second variable attenuator 203 is input into the LUT 341. When the gain information of the first variable attenuator 201 is input, the LUT 341 reads a value of SCALE associated with the gain information.

It is assumed that when, for example, the gain information of the first variable attenuator 201 is input, the value of SCALE having the relationship of the graph as shown in FIG. 18 is read. For example, a value 3 db and a value 2 db are read. The interpolation unit 342 determines whether to interpolate and output a value on the side of 3 db as SCALE or a value on the side of 2 db as SCALE based on the value of SDIST supplied from the operation unit 332 and outputs the value.

If, for example, the value of SDIST is a value corresponding to a value a in FIG. 18, a value a' read from the graph as a value corresponding to the value a is output as the value of SCALE. Also, if, for example, the value of SDIST is a value corresponding to a value b in FIG. 18, a value b' read from the graph as a value corresponding to the value b is output as the value of SCALE.

Similarly, an interpolated value of SCALE is output by the interpolation processing unit 334 from the gain information of the second variable attenuator 203 input into the LUT 341. Thus, the LUT 341 is a table in which input gain information and SCALE are associated and the interpolation unit 342 interpolates the value of SCALE recorded in the table based on SDIST.

Thus, even if the gain is discretely changed, SCALE within the step width can be interpolated by SCALE being interpolated by the AGC unit 205.

Figure 19:
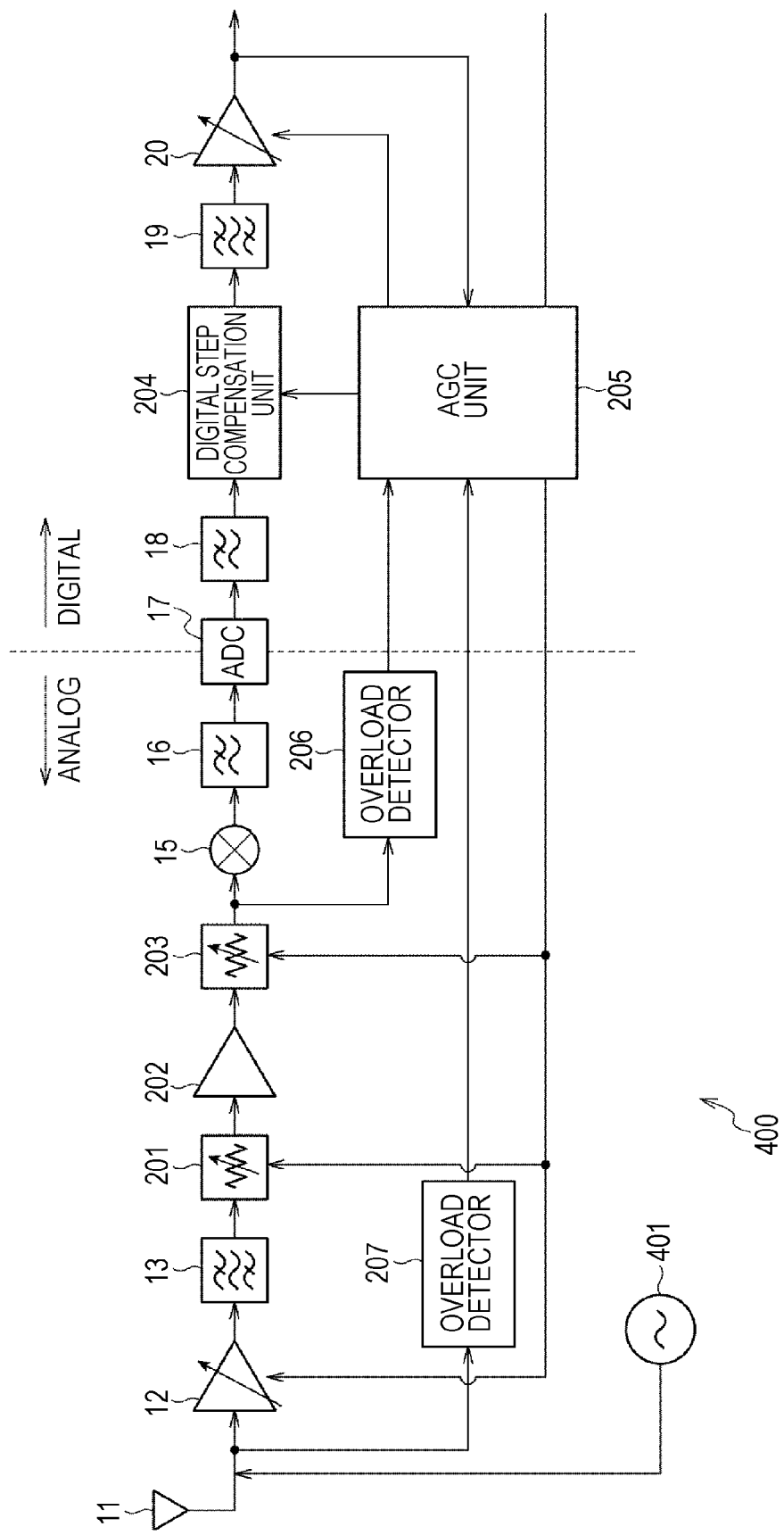
FIG. 19 is a diagram illustrating another configuration of the AGC unit.

The LUT 341 referred to perform such processing is created by, for example, an AGC system having the configuration as shown in FIG. 19. An AGC system 400 shown in FIG. 19 is configured by including a test signal output unit 401 in the AGC system 200 shown in FIG. 9. In the AGC system 400 shown in FIG. 19, a signal oscillated by the test signal output unit 401 is first input into the LNA 12 as antenna input. The gain of one of the LNA 12, the first variable attenuator 201, and the second variable attenuator 203 is made variable and other gains are set as fixed values.

The gain change in each step is measured by monitoring signal information of the AGC unit 205. The gain is discretely adjusted by having a predetermined width, for example, the width of 3 db in the analog section and thus, the width is called a step and the gain change is measured in each step like, for example, 85 db, 82 db, . . . .

For example, the gain of one of the LNA 12, the first variable attenuator 201, and the second variable attenuator 203 is made variable without changing the output of a signal oscillated by the test signal output unit 401 and each time the gain is changed, the value thereof is measured by the AGC unit 205.

In this manner, the gain change in each step is measured and the measured value is stored in the LUT 341 to create the LUT 341. Such processing may be performed by a CPU (Central Processing Unit) (not shown) or the like.

Such creation may occur once when the AGC system 400 is manufactured so that the created LUT 341 is stored as the LUT 341. Alternatively, when the AGC system 400 configured as shown in FIG. 19 is turned on for the first time, the above processing may be performed to create the LUT 341.

Alternatively, each time the AGC system 400 configured as shown in FIG. 19 is turned on, the above processing may be performed to create the LUT 341. Alternatively, when the environment around the AGC system 400 configured as shown in FIG. 19, for example, the temperature changes, the above processing may be performed to create the LUT 341.

Incidentally, the AGC unit 152 and the AGC unit 205 may be configured as described with reference to FIGS. 11 to 13 and further with reference to FIGS. 14 to 19 and the overload detectors 102, 206, 207 may be configured as described with reference to FIGS. 10A and 10B. That is, the AGC unit and the overload detector described above are technologies that can be made to coexist in one AGC system.

<Control of LNA>

Next, the control of LNA will be described. For the purpose of reference, the AGC system 10 shown in FIG. 1 is referred to again. The AGC system 10 shown in FIG. 1 is the AGC system 10 that continuously controls the gain in the analog section. The LNA 12 in the AGC system 10 is controlled independently of the AGC system 10.

A transient response due to discrete changes like ON and OFF of the LNA 12 is also observed in input into the demodulation unit in the subsequent stage, which could degrade demodulation performance. Thus, a method of reducing the influence of the transient response by, like the AGC system 200 shown in FIG. 9, exercising the control of the LNA 12 by the AGC unit 205 and incorporating the control into an AGC loop will be described below.

FIGS. 20 to 23 are diagrams illustrating a concrete control method of the LNA 12. Diagrams shown in FIGS. 20 to 23 are diagrams that associate the total gain to be obtained in the analog section, a control signal A to the LNA 12 and the gain thereof, a control signal B to the first variable attenuator 201 and the gain thereof, the gain of the gain fixed amplifier 202, a control signal C to the second variable attenuator 203 and the gain thereof, and the gain of the frequency conversion unit 15 with each other.

Viewing, for example, values associated with the total gain of "85" in FIG. 20, first when "0" is supplied to the LNA 12 as the control signal A, the gain of the LNA 12 is recorded as "15 db". The control signal A is supplied to the AGC unit 205 and the AGC unit 205 transmits a control signal of "0" when the gain of the LNA 12 should be controlled to 15 db.

Also in the place where the total gain is "85", when "0" is supplied as the control signal B to the first variable attenuator 201, the gain of the first variable attenuator 201 is recorded as "0 db".

Also in the place where the total gain is "85 db", when "0" is supplied as the control signal C to the second variable attenuator 203, the gain of the second variable attenuator 203 is recorded as "0 db".

In the example shown in FIG. 20, the gain of the gain fixed amplifier 202 is set to "40 db" regardless of the total gain. Similarly, the gain of the frequency conversion unit 15 is set to "20 db" regardless of the total gain. This also applies in FIGS. 21 to 23.

In this case, the description continues by assuming that the gain of the gain fixed amplifier 202 is "40 db" and the gain of the frequency conversion unit 15 is "30 db", but other gains may be set and if other values are set, associated gains, for example, the value of the gain of the first variable attenuator 201 is also changed appropriately.

When the total gain is "85 db", "40 db" of "85 db" is covered by the gain of the gain fixed amplifier 202 and "30 db" is covered by the frequency conversion unit 15. Thus, the gain to be covered by the LNA 12, the first variable attenuator 201, and the second variable attenuator 203 is "15(=85−40−30) db".

When the total gain is "85 db", the LNA 12 covers "15 db", the first variable attenuator 201 covers "0 db", and the second variable attenuator 203 covers "0 db" and thus, the total of these gains is "15 db". In this manner, the gain of each of the LNA 12, the first variable attenuator 201, and the second variable attenuator 203 is controlled when the total gain necessary in the analog section is "85 db".

Further, the place where the total gain is "82 db" in FIG. 20 is referred to. Examples shown in FIGS. 20 to 23 are a case in which the gain adjustment in the analog section has the step width of 3 db. In this case, therefore, "82 db" comes after "85 db". The gain is discretely adjusted in the step width of 3 db in the analog section and so 3 db is interpolated in the digital section. The interpolation is performed by the digital step compensation unit 204. When, for example, the AGC system 200 (FIG. 9) needs the gain of "85 db", it is possible for the analog section alone to obtain the gain of "85 db". When the AGC system 200 needs the gain of "84 db", the gain of "84 db" can be obtained by obtaining the gain of "82 db" in the analog section and obtaining the gain of "2 db" in the digital section. Also, the gain of "84 db" can be obtained by obtaining the gain of "85 db" in the analog section and obtaining the gain of "−1 db" in the digital section.

Thus, the AGC system 200 is configured such that the gain can substantially continuously be adjusted by adjusting a discrete gain in the analog section and adjusting the gain in the digital section so that the adjustment of the discretely gain in the analog section is compensated for.

Returning to the description of FIG. 20, when the total gain is "82 db", "70 db" is covered by the gain of "40 db" of the gain fixed amplifier 202 and the gain of "30 db" of the frequency conversion unit 15 and thus, the remaining gain of "12 db" is covered by the LNA 12, the first variable attenuator 201, and the second variable attenuator 203.

In the description that follows, the description of "70 db" obtained by adding the gain of "40 db" of the gain fixed amplifier 202 and the gain of "30 db" of the frequency conversion unit 15 is omitted and the description of how to cover the gain of a difference between the total gain and "70 db" by the LNA 12, the first variable attenuator 201, and the second variable attenuator 203 will be provided.

For "12 db" of the total gain of "82 db", first "0" is supplied to the LNA 12 as the control signal A and "15 db" is set as the gain of the LNA 12. Then, "1" is supplied to the first variable attenuator 201 as the control signal B and "−3 db" is set as the gain of the first variable attenuator 201.

Further, "0" is supplied to the second variable attenuator 203 as the control signal C and "0 db" is set as the gain of the second variable attenuator 203. By the gain of each unit being set in this manner, the gain of "12 db" is set.

Hereinafter, the gain is similarly adjusted to a desired gain of the analog section by the gain of each of the LNA 12, the first variable attenuator 201, and the second variable attenuator 203 being adjusted.

Referring to FIG. 20, if the value of the control signal A supplied to the LNA 12 is "0", the gain of the LNA 12 is set to "15 db". If the value of the control signal A supplied to the LNA 12 is "1", the gain of the LNA 12 is set to "0 db". "0" or "1" is supplied to the LNA 12 as the value of the control signal A and "0 db" or "15 db" is supplied as the gain.

While the LNA 12 will be described here by taking a case in which the LNA has two values of "0 db" and "15 db", in other words, the LNA is binary with ON and OFF as an example, the LNA 12 can also be configured so that the gain discretely changes on or more than binary gray scale. When the LNA 12 is configured so that the gain changes on more than binary levels, the gain adjustment pattern described here is adjusted thereto and applied.

When the value of the control signal B supplied to the first variable attenuator 201 is "0", the gain of the first variable attenuator 201 is set to "0 db". Also when the value of the control signal B supplied to the first variable attenuator 201 is "1", the gain of the first variable attenuator 201 is set to "−3 db". Also when the value of the control signal B supplied to the first variable attenuator 201 is "2", the gain of the first variable attenuator 201 is set to "−6 db".

Also when the value of the control signal B supplied to the first variable attenuator 201 is "3", the gain of the first variable attenuator 201 is set to "−9 db". Also when the value of the control signal B supplied to the first variable attenuator 201 is "4", the gain of the first variable attenuator 201 is set to "−12 db". Also when the value of the control signal B supplied to the first variable attenuator 201 is "5", the gain of the first variable attenuator 201 is set to "−15 db".

Also when the value of the control signal B supplied to the first variable attenuator 201 is "6", the gain of the first variable attenuator 201 is set to "−18 db". Also when the value of the control signal B supplied to the first variable attenuator 201 is "7", the gain of the first variable attenuator 201 is set to "−21 db". Also when the value of the control signal B supplied to the first variable attenuator 201 is "8", the gain of the first variable attenuator 201 is set to "−24 db".

Also when the value of the control signal B supplied to the first variable attenuator 201 is "9", the gain of the first variable attenuator 201 is set to "−27 db". Also when the value of the control signal B supplied to the first variable attenuator 201 is "10", the gain of the first variable attenuator 201 is set to "−30 db".

Thus, "0" to "10" are available as the control signal B to the first variable attenuator 201 and the gain of the first variable attenuator 201 is discretely set from "0" to "−30" in 3 db steps.

A case in which the gain of the first variable attenuator 201 is discretely set in 3 db steps is taken here as an example, but the step width may be a fixed width such as 3 db or a different width for each step.

When the value of the control signal C supplied to the second variable attenuator 203 is "0", the gain of the second variable attenuator 203 is set to "0 db". Also when the value of the control signal C supplied to the second variable attenuator 203 is "1", the gain of the second variable attenuator 203 is set to "−3 db". Also when the value of the control signal C supplied to the second variable attenuator 203 is "2", the gain of the second variable attenuator 203 is set to "−6 db".

Also when the value of the control signal C supplied to the second variable attenuator 203 is "3", the gain of the second variable attenuator 203 is set to "−9 db".

Also when the value of the control signal C supplied to the second variable attenuator 203 is "4", the gain of the second variable attenuator 203 is set to "−12 db".

Also when the value of the control signal C supplied to the second variable attenuator 203 is "5", the gain of the second variable attenuator 203 is set to "−15 db".

Also when the value of the control signal C supplied to the second variable attenuator 203 is "6", the gain of the second variable attenuator 203 is set to "−18 db".

Also when the value of the control signal C supplied to the second variable attenuator 203 is "7", the gain of the second variable attenuator 203 is set to "−21 db".

Also when the value of the control signal C supplied to the second variable attenuator 203 is "8", the gain of the second variable attenuator 203 is set to "−24 db".

Also when the value of the control signal C supplied to the second variable attenuator 203 is "9", the gain of the second variable attenuator 203 is set to "−27 db".

Also when the value of the control signal C supplied to the second variable attenuator 203 is "10", the gain of the second variable attenuator 203 is set to "−30 db".

Also when the value of the control signal C supplied to the second variable attenuator 203 is "11", the gain of the second variable attenuator 203 is set to "−33 db".

Also when the value of the control signal C supplied to the second variable attenuator 203 is "12", the gain of the second variable attenuator 203 is set to "−36 db".

Also when the value of the control signal C supplied to the second variable attenuator 203 is "13", the gain of the second variable attenuator 203 is set to "−39 db".

Also when the value of the control signal C supplied to the second variable attenuator 203 is "14", the gain of the second variable attenuator 203 is set to "−42 db".

Also when the value of the control signal C supplied to the second variable attenuator 203 is "15", the gain of the second variable attenuator 203 is set to "−45 db".

Thus, "0" to "15" are available as the control signal C to the second variable attenuator 203 and the gain of the second variable attenuator 203 is discretely set from "0" to "−45" in 3 db steps.

A case in which the gain of the second variable attenuator 203 is discretely set in 3 db steps is taken here as an example, but the step width may be a fixed width such as 3 db or a different width for each step. The description continues here by taking a case in which the step width of the gain of both of the first variable attenuator 201 and the second variable attenuator 203 is 3 db is taken as an example, but a different step width may also be adopted.

In this manner, the total gain necessary in the analog section is adjusted by the LNA 12 the first variable attenuator 201, the gain fixed amplifier 202, the second variable attenuator 203, and the frequency conversion unit 15 related to adjustments of the gain in the analog section.

When the gain necessary in the analog section changes, the gain of which of the LNA 12, the first variable attenuator 201, and the second variable attenuator 203 is to adjust is determined and the order of adjusting the gain does not matter.

The example shown in FIG. 20 shows a case in which the gains of the LNA 12 and the first variable attenuator 201 are first adjusted and then, the gain of the second variable attenuator 203 is adjusted. When the total gain is between "85 db" and "73 db", the total gain is adjusted by changing the gain of the first variable attenuator 201 from "0 db" to "−12 db" while the gain of the LNA 12 is set to "15 db". In the meantime, the gain of the second variable attenuator 203 remains at "0 db". When the total gain is between "70 db" and "40 db", the total gain is adjusted by changing the gain of the first variable attenuator 201 from "0 db" to "−30 db" while the gain of the LNA 12 is set to "0 db". In the meantime, the gain of the second variable attenuator 203 remains at "0 db".

When the total gain is between "37 db" and "−5 db", the gain of the LNA 12 is set to "0 db" and the gain of the first variable attenuator 201 is set to "−30 db". Because the total gain is not achieved only by adjusting the gain of the LNA 12 and the gain of the first variable attenuator 201, in this case, the gain of the second variable attenuator 203 is also changed from "0 db" to "−45 db".

Thus, the gain adjustment pattern shown in FIG. 20 is a case in which the gain of the first variable attenuator 201 is first adjusted and then, the gain of the second variable attenuator 203 is adjusted.

The example shown in FIG. 21 is a case in which the gain of the second variable attenuator 203 is first adjusted and then, the gain of the first variable attenuator 201 is adjusted. Referring to FIG. 21, when the total gain is between "85 db" and "73 db", the total gain is adjusted by changing the gain of the second variable attenuator 203 from "0 db" to "−12 db" while the gain of the LNA 12 is set to "15 db". In the meantime, the gain of the first variable attenuator 201 remains at "0 db". When the total gain is between "70 db" and "25 db", the total gain is adjusted by changing the gain of the second variable attenuator 203 from "0 db" to "−45 db" while the gain of the LNA 12 is set to "0 db". In the meantime, the gain of the first variable attenuator 201 remains at "0 db".

When the total gain is between "22 db" and "−5 db", the gain of the LNA 12 is set to "0 db" and the gain of the second variable attenuator 203 is set to "−45 db". Because the total gain is not achieved only by adjusting the gain of the LNA 12 and the gain of the second variable attenuator 203, in this case, the gain of the first variable attenuator 201 is also changed from "0 db" to "−30 db".

Thus, the example shown in FIG. 21 is a case in which the gain of the second variable attenuator 203 is first adjusted and then, the gain of the first variable attenuator 201 is adjusted.

FIG. 22 shows, like the gain adjustment pattern shown in FIG. 20, a gain adjustment pattern in which the gain of the first variable attenuator 201 is first adjusted and then, the gain of the second variable attenuator 203 is adjusted, but is different in timing in which the gain of the LNA 12 is switched from "15 db" to "0 db".

Referring to FIG. 22, when the total gain is between "85 db" and "58 db", the total gain is adjusted by changing the gain of the first variable attenuator 201 from "0 db" to "−27 db" while the gain of the LNA 12 is set to "15 db". In the meantime, the gain of the second variable attenuator 203 remains at "0 db".

When the total gain is between "55 db" and "40 db", the total gain is adjusted by changing the gain of the first variable attenuator 201 from "−15 db" to "−30 db" while the gain of the LNA 12 is set to "0 db". In the meantime, the gain of the second variable attenuator 203 remains at "0 db".

When the total gain is between "37 db" and "−5 db", the gain of the LNA 12 is set to "0 db" and the gain of the first variable attenuator 201 is set to "−30 db". Because the total gain is not achieved only by adjusting the gain of the LNA 12 and the gain of the first variable attenuator 201, in this case, the gain of the second variable attenuator 203 is also changed from "0 db" to "−45 db".

Thus, the example shown in FIG. 22 is a case in which the gain of the first variable attenuator 201 is first adjusted and then, the gain of the second variable attenuator 203 is adjusted. In which timing to set the gain to which gain of each of the LNA 12, the first variable attenuator 201, and the second variable attenuator 203 can appropriately be changed.

The examples shown in FIGS. 20 to 22 describe a gain adjustment pattern in which the gain of the first variable attenuator 201 or the second variable attenuator 203 is first adjusted and then, the gain of the second variable attenuator 203 or the first variable attenuator 201 is adjusted. The order of adjusting the gain (combination of gain adjustments) like alternately adjusting the gain of the first variable attenuator 201 and the gain of the second variable attenuator 203 is not limited to the illustrated cases and can appropriately be changed.

Referring to FIG. 23, when the total gain is "85 db", the gain of the LNA 12 is set to "15 db" and the gains of the first variable attenuator 201 and the second variable attenuator 203 are set to "0 db".

When the total gain is "82 db", the gain of the LNA 12 is set to "15 db", the gain of the first variable attenuator 201 is set to "−3 db", and the gain of the second variable attenuator 203 are set to "0 db". When the total gain is "79 db", the gain of the LNA 12 is set to "15 db", the gain of the first variable attenuator 201 is set to "−3 db", and the gain of the second variable attenuator 203 are set to "−3 db".

When the total gain is "76 db", the gain of the LNA 12 is set to "15 db", the gain of the first variable attenuator 201 is set to "−6 db", and the gain of the second variable attenuator 203 are set to "−3 db". When the total gain is "73 db", the gain of the LNA 12 is set to "15 db", the gain of the first variable attenuator 201 is set to "−6 db", and the gain of the second variable attenuator 203 are set to "−6 db".

Hereinafter, the total gain of the analog section is similarly adjusted by the gain of the first variable attenuator 201 and the gain of the second variable attenuator 203 being alternately adjusted. In this manner, the gain of the first variable attenuator 201 and the gain of the second variable attenuator 203 may alternately be adjusted.

The example shown here is by way of example and how to change the gain of each of the LNA 12, the first variable attenuator 201, and the second variable attenuator 203 in which order is not limited to the above example.

When, for example, adjustments are made according to one of adjustment patterns shown in FIGS. 20 to 23, the gain may be adjusted by one of adjustment patterns in FIGS. 20 to 23 being applied or a plurality of adjustment patterns in FIGS. 20 to 23 may be applied by being switched after predetermined conditions are satisfied.

By incorporating the control of the LNA 12 into gain adjustments by the control of the first variable attenuator 201 or the second variable attenuator 203 as described above, the first variable attenuator 201 and the second variable attenuator 203 can be made to be controlled simultaneously during control of the LNA 12 to reduce the gain step width of the total gain in the analog section to the step width of a variable attenuator. However, it is preferable to make the step width of a variable attenuator smaller than that of the LNA 12 and to control the LNA 12 in a state in which the attenuation by the variable attenuator exceeds the step width of the LNA. Further, a more flexible AGC loop can be formed by controlling the control order of variable attenuators and the control order of LNA by a register or the like.

When controlling the LNA 12, an instantaneous over-input into the ADC unit 17 can be prevented by shifting the control timing of the LNA and that of a variable attenuator as shown below:

When the total gain is raised,
Raise the gain of the LNA after lowering the gain of the variable attenuator
When the total gain is lowered,
Raise the gain of the variable attenuator after lowering the gain of the LNA Such circumstances are taken into consideration in each pattern shown in FIGS. 20 to 23.

Such gain adjustments can also be made by combining a case in which the overload detectors 102, 206, 207 are configured as described with reference to FIGS. 10A and 10B, a case in which the AGC units 152, 205 are configured as described with reference to FIGS. 11 to 13 or a case in which the AGC units 152, 205 are configured as described with reference to FIGS. 14 to 19. That is, the AGC unit and the overload detector described above are technologies that can be made to coexist in one AGC system.

Thus, according to an embodiment of the present technology, a configuration from which an analog component has been eliminated can be adopted and can be made to be suitable for the size reduction or lower power consumption. In addition, even if discrete gain control is exercised, an impact on reception performance due to discrete gain changes can be reduced.

<Recording Medium>

The above set of processing can be performed by hardware or software. When the set of processing is performed by software, a program constituting the software is installed on a computer. The computer includes a computer embedded in dedicated hardware and, for example, a general-purpose personal computer capable of executing various functions by installing various programs.

FIG. 24 is a block diagram showing a configuration example of hardware of a computer that performs the above set of processing by a program. In the computer, a CPU (Central Processing Unit) 1101, ROM (Read Only Memory) 1102, and RAM (Random Access Memory) 1103 are mutually connected by a bus 1104. The bus 1104 is further connected to an input/output interface 1105. An input unit 1106, an output unit 1107, a storage unit 1108, a communication unit 1109, and a drive 1110 are connected to the input/output interface 1105.

The input unit 1106 includes a keyboard, a mouse, a microphone and the like. The output unit 1107 includes a display, a speaker and the like. The storage unit 1108 includes a hard disk, nonvolatile memory or the like.

The communication unit 1109 includes a network interface and the like. The drive 1110 drives a magnetic disk, an optical disk, a magneto-optical disk, or a removable medium 1111 such as semiconductor memory.

In the computer configured as described above, the above set of processing is performed by, for example, a program stored in the storage unit 1108 being loaded into the RAM 1103 via the input/output interface 1105 and the bus 1104 and being executed by the CPU 1101.

The program executed by the computer (CPU 1101) can be provided by, for example, recording in the removable medium 1111 as a package medium or the like. The program can also be provided via a wire or wireless transmission medium such as a local area network, the Internet, and digital satellite broadcasting.

In the computer, the program can be installed in the storage unit 1108 via the input/output interface 1105 by inserting the removable medium 1111 into the drive 1110. The program can also be installed in the storage unit 1108 by receiving the program through the communication unit 1109 via a wire wireless transmission medium. In addition, the program can be pre-installed in the ROM 1102 or the storage unit 1108.

The program executed by the computer may be a program in which processing is performed chronologically in the order described herein or a program in which processing is performed in parallel or when invoked in necessary timing.

In the present specification, a system represents a whole apparatus including a plurality of apparatuses.

Effects described herein are intended only as an illustration and should not be limited and other effects may also be achieved.

The embodiment of the present technology is not limited to the above embodiment and various modifications can be made without deviating from the spirit of the present technology.

The present technology can adopt the configuration as described below.

(1)
A signal processing apparatus including:
an analog section in which an acquired signal is processed in an analog fashion; and
a digital section in which the signal processed in the analog section is digitally processed, wherein
the analog section includes an adjustment unit that adjusts a gain discretely and
the digital section includes a digital step compensation unit that compensates for discrete gain adjustments in the analog section.

(2)
The signal processing apparatus according to (1), wherein the digital step compensation unit responds to a transient step in which a gain steeply converts in the analog section and compensates with inverse characteristics of a transient response.

(3)
The signal processing apparatus according to (1) or (2), wherein the digital step compensation unit adjusts the gain in a width smaller than the width of the gain adjusted by the adjustment unit.

(4)
The signal processing apparatus according to any of (1) to (3), further including:
a gain control unit that controls the gain of the adjustment unit and the digital step compensation unit; and
an overload detector that detects a signal level of the signal and outputs a comparison result with a predetermined threshold, wherein
the gain control unit controls the gain based on the comparison result from the overload detector.

(5)
The signal processing apparatus according to (4), wherein the overload detector has a first threshold and a second threshold larger than the first threshold and
when the signal level is larger than the first threshold and smaller than the second threshold as the comparison result, the gain control unit exercises control that maintains the gain set at that time.

(6)
The signal processing apparatus according to (4) or (5), wherein
the overload detector detects the signal level of the signal from the adjustment unit, and
the gain control unit controls the gain of the adjustment unit.

(7)
The signal processing apparatus according to any of (4) to (6), wherein
the gain control unit has hysteresis.

(8)
The signal processing apparatus according to any of (4) to (6), wherein
the gain control unit exercises different control when the gain necessary for the analog section rises and falls.

(9)
The signal processing apparatus according to any of (4) to (8), wherein
the gain control unit includes LUT (Look-Up-Table) and corrects discrete gain variations in the analog section by referring to the LUT.

(10)
The signal processing apparatus according to (9), wherein the LUT is created by a value measured by the gain control unit when a test signal is input being stored therein.

(11)
The signal processing apparatus according to any of (4) to (10), wherein
the adjustment unit includes an LNA (Low Noise Amplifier) and a variable attenuator.

(12)
The signal processing apparatus according to (11), wherein a plurality of the variable attenuators is included, and the gain control unit controls the gain of each of the LNA and the plurality of variable attenuators.

(13)
The signal processing apparatus according to (11) or (12), wherein
the LNA discretely sets the gain at binary or more gray scale.

(14)
The signal processing apparatus according to any of (11) to (13), wherein
the variable attenuator discretely sets the gain and the width thereof is a fixed width or a width that is different from step to step.

(15)
The signal processing apparatus according to any of (11) to (13), wherein
the gain control unit raises the gain of the LNA after lowering the gain of the variable attenuator when the gain necessary for the analog section is raised and raises the gain of the variable attenuator after lowering the gain of the LNA when the gain necessary for the analog section is lowered.

(16)
A signal processing method of a signal processing apparatus including:
an analog section in which an acquired signal is processed in an analog fashion; and
a digital section in which the signal processed in the analog section is digitally processed, the signal processing method including:
adjusting a gain discretely in the analog section and making digital step compensation in the digital section that compensates for discrete gain adjustments in the analog section.

(17)
A non-transitory computer-readable storage medium storing a program causing a computer that controls a signal processing apparatus including
an analog section in which an acquired signal is processed in an analog fashion, and
a digital section in which the signal processed in the analog section is digitally processed
to perform processing including:
adjusting a gain discretely in the analog section; and making digital step compensation in the digital section that compensates for discrete gain adjustments in the analog section.

REFERENCE SIGNS LIST

11 Antenna
12 LNA
13 RF filter
15 Frequency conversion unit
16 IF filter
17 ADC unit
18 Decimation filter
19 Neighboring channel filter
20 Digital gain variable amplifier
101 Gain variable amplifier
102 Overload detector
103 AGC unit
201 First variable attenuator
202 Gain fixed amplifier
203 Second variable attenuator
206,207 Overload detector

The invention claimed is:
1. A signal processing apparatus comprising:
an analog section in which an acquired signal is processed in an analog fashion; and
a digital section in which the signal processed in the analog section is digitally processed, wherein
the analog section includes an adjustment unit that adjusts a gain discretely and
the digital section includes:
a digital gain variable amplifier, and
a digital step compensation unit that modifies the signal to compensate for discrete gain adjustments in the analog section.

2. The signal processing apparatus according to claim 1, wherein the digital step compensation unit responds to a transient step in which a gain steeply converts in the analog section and compensates with inverse characteristics of a transient response.

3. The signal processing apparatus according to claim 1, wherein the digital step compensation unit adjusts the gain in a width smaller than the width of the gain adjusted by the adjustment unit.

4. The signal processing apparatus according to claim 1, further comprising:
a gain control unit that controls the gain of the adjustment unit and the digital step compensation unit; and
an overload detector that detects a signal level of the signal and outputs a comparison result with a predetermined threshold, wherein
the gain control unit controls the gain based on the comparison result from the overload detector.

5. The signal processing apparatus according to claim 4, wherein the overload detector has a first threshold and a second threshold larger than the first threshold, and
when the signal level is larger than the first threshold and smaller than the second threshold as the comparison result, the gain control unit exercises control that maintains the gain set at that time.

6. The signal processing apparatus according to claim 4, wherein the overload detector detects the signal level of the signal from the adjustment unit, and
the gain control unit controls the gain of the adjustment unit.

7. The signal processing apparatus according to claim 4, wherein the gain control unit has hysteresis.

8. The signal processing apparatus according to claim 4, wherein the gain control unit exercises different control when the gain necessary for the analog section rises and falls.

9. The signal processing apparatus according to claim 4, wherein the gain control unit includes LUT (Look-Up-Table) and corrects discrete gain variations in the analog section by referring to the LUT.

10. The signal processing apparatus according to claim 9, wherein the LUT is created by a value measured by the gain control unit when a test signal is input being stored therein.

11. The signal processing apparatus according to claim 4, wherein the adjustment unit includes an LNA (Low Noise Amplifier) and a variable attenuator.

12. A signal processing apparatus comprising:
an analog section in which an acquired signal is processed in an analog fashion; and
a digital section in which the signal processed in the analog section is digitally processed,
wherein the analog section includes an adjustment unit that adjusts a gain discretely,
the digital section includes a digital step compensation unit that compensates for discrete gain adjustments in the analog section, the signal processing apparatus further comprises a gain control unit that controls the gain of the adjustment unit and the digital step compensation unit, the signal processing apparatus further comprises an overload detector that detects a signal level of the signal and outputs a comparison result with a predetermined threshold, the gain control unit controls the gain based on the comparison result from the overload detector, the adjustment unit includes an LNA (Low Noise Amplifier) and a variable attenuator, a plurality of the variable attenuators is included, and the gain control unit controls the gain of each of the LNA and the plurality of variable attenuators.

13. The signal processing apparatus according to claim 11, wherein the LNA discretely sets the gain at two levels or more.

14. The signal processing apparatus according to claim 11, wherein the variable attenuator discretely sets the gain and the width thereof is a fixed width or a width that is different from step to step.

15. The signal processing apparatus according to claim 11, wherein the gain control unit raises the gain of the LNA after lowering the gain of the variable attenuator when the gain necessary for the analog section is raised and raises the gain of the variable attenuator after lowering the gain of the LNA when the gain necessary for the analog section is lowered.

16. A signal processing method of a signal processing apparatus including an analog section in which an acquired signal is processed in an analog fashion, and a digital section in which the signal processed in the analog section is digitally processed, the signal processing method comprising:

adjusting a gain discretely in the analog section; and making digital step compensation in the digital section that compensates for discrete gain adjustments in the analog section by applying inverse characteristics of transients arising from the discrete gain adjustment.

17. A non-transitory computer-readable storage medium storing a program causing a computer that controls a signal processing apparatus including an analog section in which an acquired signal is processed in an analog fashion, and a digital section in which the signal processed in the analog section is digitally processed to perform processing comprising:

adjusting a gain discretely in the analog section; and making digital step compensation in the digital section that compensates for discrete gain adjustments in the analog section by applying inverse characteristics of transients arising from the discrete gain adjustment.

18. A signal processing apparatus comprising:

an adjustment unit that modifies a received signal in an analog processing stage and that has a gain that is adjusted discretely; and a digital step compensation unit that modifies the received signal in a digital processing stage by applying inverse characteristics of a transient response associated with discrete gain adjustments of the adjustment unit.

19. The signal processing apparatus of claim 18, wherein the digital step compensation applies the inverse characteristics by making continuous gain adjustments to interpolate the discrete gain adjustments of the adjustment unit.

20. The signal processing apparatus of claim 18, wherein each step width at which a gain of the digital step compensation unit is adjusted is smaller than a minimum step width at which the gain of the adjustment unit is adjusted.

* * * * *